(12) United States Patent
Yang et al.

(10) Patent No.: US 10,985,537 B2
(45) Date of Patent: Apr. 20, 2021

(54) POWER OVERLAY ARCHITECTURE

(71) Applicant: GE AVIATION SYSTEMS LLC, Grand Rapids, MI (US)

(72) Inventors: Liqiang Yang, Pompano Beach, FL (US); Richard Anthony Eddins, Margate, FL (US); Robert Lloyd George, Delray Beach, FL (US); Darrell Lee Grimes, Boca Raton, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 16/402,914

(22) Filed: May 3, 2019

(65) Prior Publication Data

US 2020/0091686 A1 Mar. 19, 2020

Related U.S. Application Data

(60) Provisional application No. 62/731,369, filed on Sep. 14, 2018.

(51) Int. Cl.
| | |
|---|---|
| *H02B 1/04* | (2006.01) |
| *H02B 1/24* | (2006.01) |
| *H02M 7/00* | (2006.01) |
| *H05K 1/18* | (2006.01) |
| *B64D 33/00* | (2006.01) |

(52) U.S. Cl.
CPC ............ *H02B 1/04* (2013.01); *B64D 33/00* (2013.01); *H02B 1/24* (2013.01); *H02M 7/003* (2013.01); *H05K 1/181* (2013.01); *H05K 2201/10053* (2013.01); *H05K 2201/10166* (2013.01)

(58) Field of Classification Search
CPC ............ H02B 1/04; H02B 1/24; B64D 33/00; H02M 7/003; H05K 1/181; H05K 2201/10053; H05K 2201/10166
USPC ......................................................... 361/631
See application file for complete search history.

(56) References Cited

U.S. PATENT DOCUMENTS

| | | | | |
|---|---|---|---|---|
| 6,046,921 A | * | 4/2000 | Tracewell | H02M 3/00 361/696 |
| 6,205,029 B1 | * | 3/2001 | Byrne | H05K 7/1457 174/68.2 |
| 6,947,287 B1 | * | 9/2005 | Zansky | G06F 1/26 361/690 |

(Continued)

FOREIGN PATENT DOCUMENTS

WO WO-2016141999 A1 * 9/2016 ........... H05K 7/1457

OTHER PUBLICATIONS

Liang Z X et al., "Integrated Packaging of a 1kW Switching Module Using Planar Interconnect on Embedded Power Chips Technology", Feb. 9, 2003, pp. 42-47, New York, NY.

(Continued)

*Primary Examiner* — Anatoly Vortman
(74) *Attorney, Agent, or Firm* — McGarry Bair PC

(57) ABSTRACT

A modular power overlay architecture includes at least two sets of power overlay tiles arranged to provide for or meet a desired power overlay architecture demand. The power overlay assembly can include a base having seats to receive the power overlay tiles. The power overlay tiles can include power switching components arranged relative to a conductive surface commonly arranged relative to each of the at least two sets of power overlay tiles.

14 Claims, 16 Drawing Sheets

(56) References Cited

U.S. PATENT DOCUMENTS

| | | | | |
|---|---|---|---|---|
| 8,570,739 | B2* | 10/2013 | Pergolesi | H02M 7/003 |
| | | | | 361/688 |
| 9,966,878 | B2* | 5/2018 | Huang | H02M 7/797 |
| 10,305,264 | B2* | 5/2019 | Brett | H05K 7/1457 |
| 10,531,587 | B2* | 1/2020 | Compton | H05K 5/0247 |
| 2002/0193015 | A1* | 12/2002 | Milan | G06F 13/4095 |
| | | | | 439/752.5 |
| 2012/0228268 | A1* | 9/2012 | Morita | B23H 1/022 |
| | | | | 219/69.11 |
| 2016/0172995 | A1 | 6/2016 | Obiraki et al. | |
| 2018/0069383 | A1* | 3/2018 | Brett | H05K 7/1457 |

OTHER PUBLICATIONS

European Patent Office, European Search Report re Application No. 19197292.6-1212, dated Feb. 11, 2020, 9 pages, Munich, Germany.

\* cited by examiner

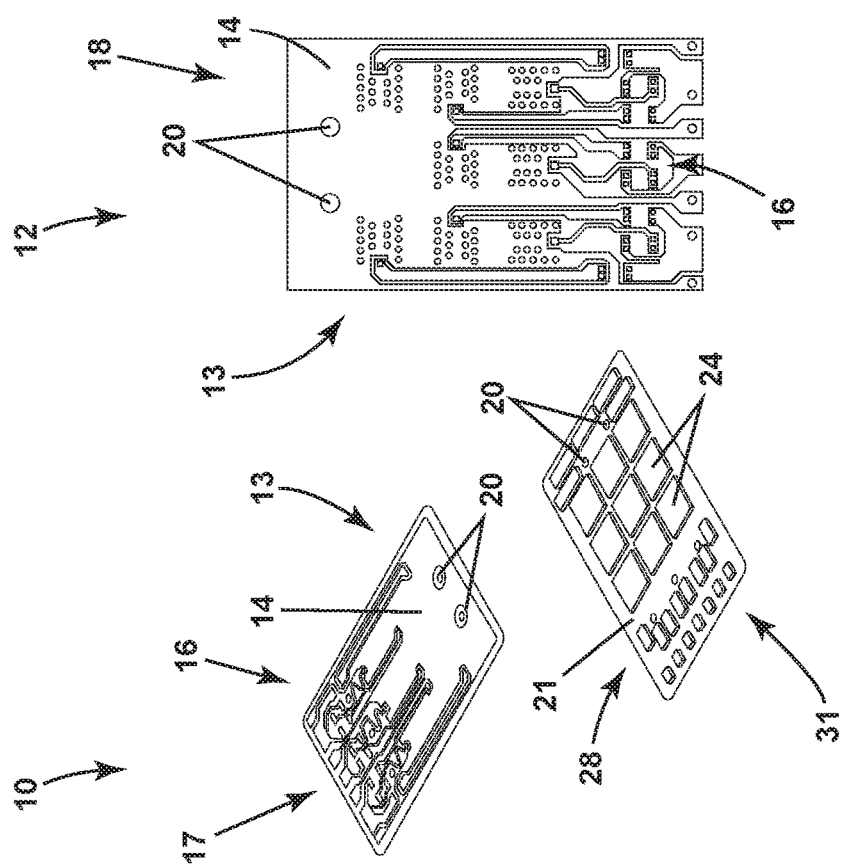
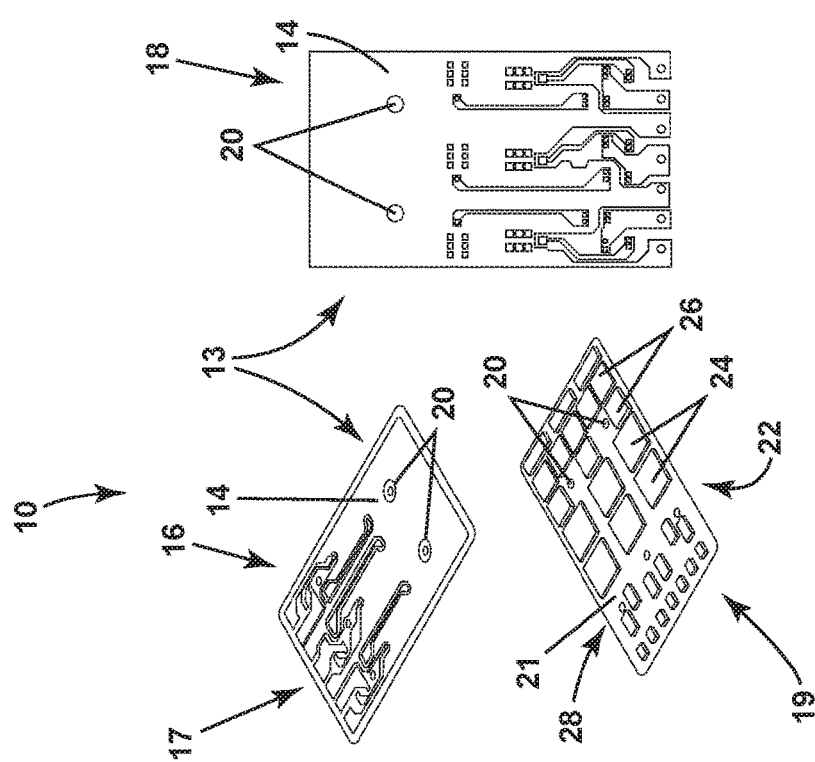
FIG. 1

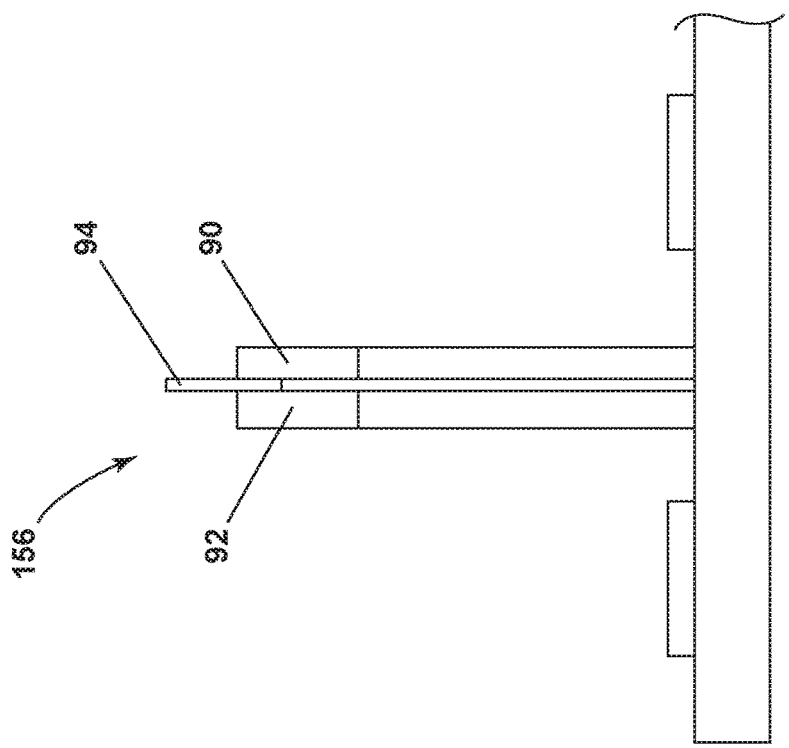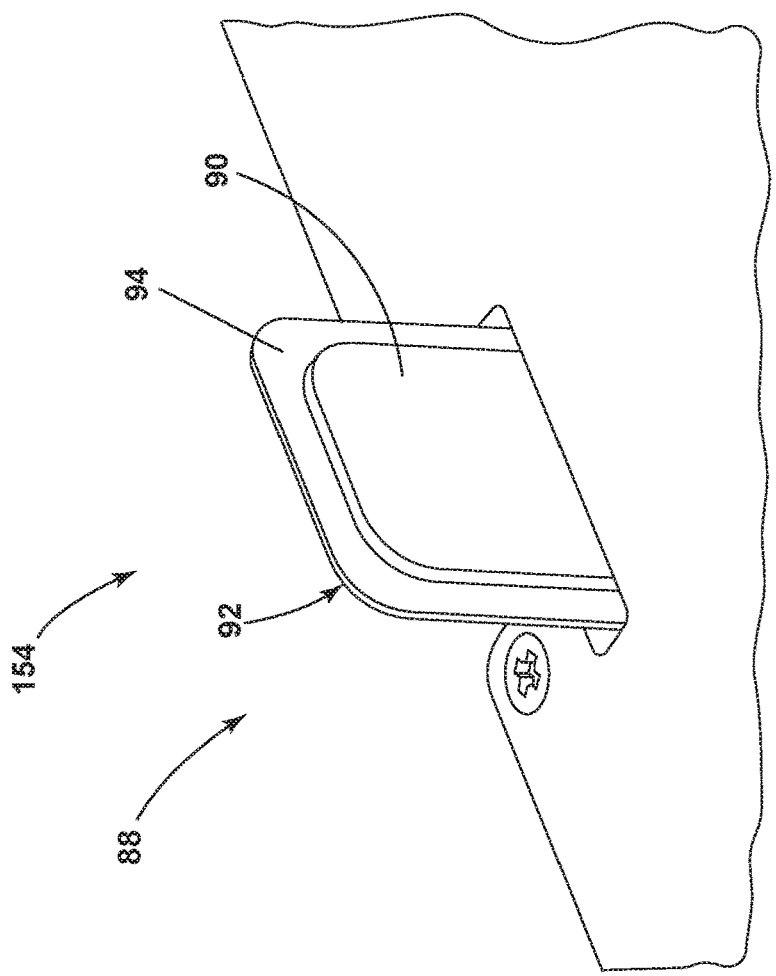
FIG. 8

POWER OVERLAY ARCHITECTURE

CROSS-REFERENCE TO RELATED APPLICATIONS

This application claims the benefit of U.S. Provisional Patent Application No. 62/731,369, filed on Sep. 14, 2018, which is incorporated herein by reference in its entirety.

BACKGROUND OF THE INVENTION

Power systems, manage the supplying of power from power sources, such as generators, to electrical loads. In one non-limiting example of an aircraft, gas turbine engines are used for propulsion of the aircraft, and typically provide mechanical power which ultimately powers a number of different accessories such as generators, starter/generators, permanent magnet alternators (PMA), fuel pumps, and hydraulic pumps, e.g., equipment for functions needed on an aircraft other than propulsion. For example, contemporary aircraft need electrical power for avionics, motors, and other electric equipment. A generator coupled with a gas turbine engine will convert the mechanical power of the engine into electrical energy which is distributed throughout the aircraft by electrically coupled nodes of the power distribution system.

BRIEF DESCRIPTION

In one aspect, the present disclosure relates to a modular power overlay architecture, including a first set of power overlay tiles defining a substantially planar arrangement of power switching components arranged on a first substrate and defining a first planar footprint, a second set of power overlay tiles defining a substantially planar arrangement of power switching components arranged on a second substrate and defining a second planar footprint, the second planar footprint equal to the first planar footprint, and a power overlay assembly base having a set of seats sized to selectively receive a subset of the first set of power overlay tiles, a subset of the second power overlay tiles, or a subset of first and second power overlay tiles. The selectively receiving of the subset of power overlay tiles is based on a satisfying a desired power module characteristics and wherein the subset of power overlay tiles are further replaceably interchangeable.

In another aspect, the present disclosure relates to a method of configuring a power overlay architecture, the method including determining a power overlay architecture demand, based on the power overlay architecture demand, selecting a set of power overlay tiles from at least two power overlay tile configurations, wherein each of the at least two power overlay tile configurations includes a substantially planar arrangement of power switching components arranged on a substrate and defining a common planar footprint, and receiving, by a power overlay assembly base having a set of seats sized to receive the common planar footprint, the set of power overlay tiles in the set of seats, such that the arrangement of the receiving satisfies the determined power overlay architecture demand.

BRIEF DESCRIPTION OF THE DRAWINGS

In the drawings:

FIG. 1 illustrates a set of isometric views of power overlay (POL) components, in accordance with various aspects described herein.

FIG. 8 illustrates a set of view of a DC input utilized in any of the POL module assemblies, in accordance with various aspects described herein.

DESCRIPTION OF EMBODIMENTS OF THE INVENTION

Figure 2:
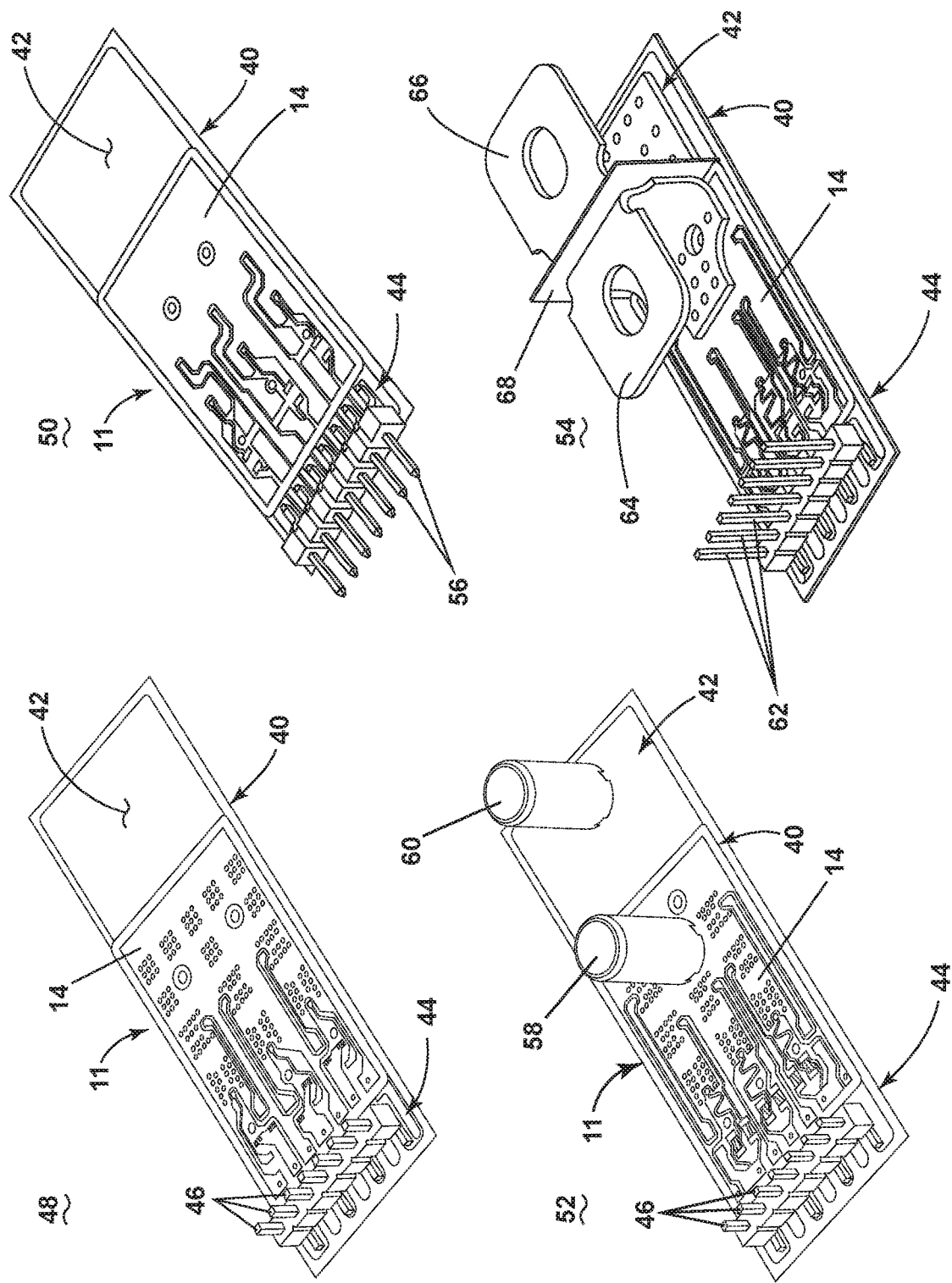
FIG. 2 illustrates a set of isometric views of POL assemblies including the power overlay components of FIG. 1, in accordance with various aspects described herein.

The described aspects of the present disclosure are directed to an electrical power assembly or an electrical power architecture, for example, for an aircraft. While an aircraft is specifically mentioned, the electrical power assembly or electrical power architecture can be utilized in any power system.

While "a set of" various elements will be described, it will be understood that "a set" can include any number of the respective elements, including only one element. As used herein, the terms "axial" or "axially" refer to a dimension along a longitudinal axis of an engine or along a longitudinal axis of a component disposed within the engine. As used herein, the terms "radial" or "radially" refer to a dimension extending between a center longitudinal axis of the power contactor, an outer engine circumference, or a circular or annular component of the power contactor or posts. The use of the terms "proximal" or "proximally," either by themselves or in conjunction with the terms "radial" or "radially,"

refers to moving in a direction toward the center post, or a component being relatively closer to the center post as compared to another component. Additionally, while terms such as "voltage", "current", and "power" can be used herein, it will be evident to one skilled in the art that these terms can be interchangeable when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

The disclosure can be implemented in any electrical circuit environment having a switch. A non-limiting example of an electrical circuit environment that can include aspects of the disclosure can include an aircraft power system architecture, which enables production of electrical power from at least one spool of a turbine engine, preferably a gas turbine engine, and delivers the electrical power to a set of electrical loads via at least one solid state switch, such as a solid state power controller (SSPC) switching device. One non-limiting example of the SSPC can include metal-oxide-semiconductor field-effect transistor (MOSFET), such as a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein.

The exemplary drawings are for purposes of illustration only and the dimensions, positions, order and relative sizes reflected in the drawings attached hereto can vary.

FIG. 1 illustrates non-limiting examples of a power overlay (POL) components 10, 12 for the electrical power assembly or the electrical power architecture. A first example POL component 10 can include a top portion 13, shown in isometric view 17, and a bottom portion 22, shown in a bottom-up isometric view 19. Stated another way, views 17 and 19 are illustrating the same first POL component 10 from different perspectives. The top portion 13 is further shown in a top down view 18, for understanding.

The top portion 13 can include to top conductive surface 14 having mounting or alignment apertures 20 and a set of conductive traces 16, disposed upon a bottom non-conductive substrate 21. The bottom portion 22 can include a set of electrical components disposed on the substrate 21. In one non-limiting example of the first POL component 10, the set of electrical components can include a set of solid state switching devices 24 and a set of rectifying components, such as a set of diodes 26. The set of electrical components can further include a set of gate devices 28 adapted, configured, or otherwise selected to operate the gates of the respective set of solid state switching devices 24. At least a subset of the set of electrical components 24, 26 can be conductively exposed on the surface normal to the substrate 21.

During operation, a current can be supplied to the top conductive surface 14, which acts or operates as a source terminal for the first POL component 10. The top conductive surface 14 can further be conductively connected with at least a subset of the electrical components 24, 26. The set of solid state switching devices 24 can be operable in response to the gate signals delivered by way of the set of conductive traces 16 to the set of gate devices 28, and can resultantly deliver the current to the bottom surface of the set of solid state switching devices 24 normal to the substrate 21, which collectively act or operate as a drain terminal for the first POL component 10.

A second POL component 12 is shown, and can be similar to the first POL component 10; therefore, like parts will be identified with like numerals, with it being understood that the description of the like parts of the first POL component 10 applies to the second POL component 12, unless otherwise noted. One difference between the first POL component 10 and the second POL component 12 is that the second POL component 10 does not include the set of diodes 26, and instead includes additional solid state switching devices 24, compared with the first POL component 10.

Each of the first and second POL components 10, 12 can operably allow for switching operations in power applications. Conventional current devices contain multiple wire bonds for device attachment. The POL design structure eliminates wire bonds and enables or provides for direct connection to devices to reduce inductance and decrease device switching times. In addition, POL allows a circuit design to further optimize the inductance and impedance of each MOSFET or set of solid state switching devices 24 a path for balance and fast switching.

In this disclosure, the POL components 10, 12 are balanced for the inductance and impedance for the multiple rows of solid state switching devices 24. For example, each of the set of solid state switching devices 24 can be designed to be within 10% inductance and impedance of each other to provide the quickest switch time, up to 2 MHz. The current flow of the POL components 10, 12 are more controlled or controllable through the channel of the set of solid state switching devices 24 as they are in line with each other. This forces the power of the set of solid state switching devices 24 to flow easily from source to drain as they are switched. This parallel connection of the set of solid state switching devices 24 on the POL components 10, 12 provides a much better current flow versus conventional wire bond connected modules. This type of POL components 10, 12 solves some of the issues due to inductance and impedance.

In one non-limiting example, the inclusion of the set of diodes 26 of the first POL component 10 can operably enable the ultra-high frequency switching of the first POL component 10 (e.g. faster than, for example, the second POL component 12), while the elimination of the set of diodes 26 and the inclusion of additional solid state switching devices 24 of the second POL component 12 can operably enable higher current switching (e.g. higher power switching, relative to the first POL component 10).

FIG. 2 illustrates non-limiting examples of electronic packaging POL assemblies for the first or second POL components 10, 12 (hereafter, collectively referred to as "POL component" 11). For the reader's understanding, not all aspects of the previously-described POL components 10, 11, 12 will be duplicated in the drawings.

In a first example POL assembly 48, the POL component 11 can be received by a second substrate 40 having a conductive surface 42 in conductive contact with the conductive surface of the set of solid state switching devices 24 extending normally away from the bottom side of the non-conductive substrate 21 of the POL component 11. In this sense, the conductive surface 42 can act or operate as the drain for the first POL assembly 48, and the top conductive surface 14 of the POL component 11 can act or operate as the source connection for the first POL assembly 48. The first POL assembly 48 is also shown to have pinout assembly 46 conductive connected with a corresponding set of terminals 44, further connected to the set of gate devices 28. In this example, the pinout assembly 46 extends normally upward and away from the first POL assembly 48 (or a planar top surface thereof).

A second example POL assembly 50 can be similar to the first POL assembly 48; therefore, like parts will be identified with like numerals, with it being understood that the description of the like parts of the first POL assembly 48 applies to the second example POL assembly 50, unless otherwise noted. The second POL assembly 50 can include a second pinout assembly 56 that extends in parallel and away from a planar top surface of the second POL assembly 50.

A third example POL assembly 52 can be similar to the first POL assembly 48; therefore, like parts will be identified with like numerals, with it being understood that the description of the like parts of the first POL assembly 48 applies to the third example POL assembly 52, unless otherwise noted. A difference in the third POL assembly 52 is that the top conductive surface 14 includes a first conductive element, shown as a first post 58, extending normally upward and away from the third POL assembly 52 (or a planar top surface thereof). Additionally, or alternatively, the third POL assembly 52 can include a second conductive element, shown as a second post 60, extending normally upward and away from the conductive surface 42 of the third POL assembly 52. In this sense, non-limiting aspects of the disclosure can be included wherein the first and second posts 58, 60 can act or operate as conductive connectors for the respective source and drain terminals of the third POL assembly 52.

A fourth POL assembly 54 can be similar to the first POL assembly 48; therefore, like parts will be identified with like numerals, with it being understood that the description of the like parts of the first POL assembly 48 applies to the fourth POL assembly 54, unless otherwise noted. A difference in the fourth POL assembly 54 is that the top conductive surface 14 includes a third conductive element, shown as a first connector 64, extending upward and away from the fourth POL assembly 54 (or a planar top surface thereof). Additionally, or alternatively, the fourth POL assembly 54 can include a fourth conductive element, shown as a second connector 66, extending upward and away from the conductive surface 42 of the fourth POL assembly 54. Each of the first and second connectors 64, 66 can be configured or adapted, for example, to receive a mechanical screw-type interface for conductively connecting with the respective source and drain terminals of the fourth POL assembly 54. Additionally, the fourth POL assembly 54 is shown to include a first non-conductive layer 68 disposed between normally extending arm segments of the respective first and second connectors 64, 66 to prevent conductive contact between the connectors 64, 66, while allowing the arm segments to non-conductively abut each other, for example, for strength or rigidity relative to the fourth POL assembly 54. In non-limiting examples, the non-conductive layer can include a non-conductive powder coating. In another non-limiting example, an alternative pinout assembly 62 extends normally upward and away from the fourth POL assembly 54 (or a planar top surface thereof) further than the pinout assembly 46 of the first POL assembly 48. In another non-limiting example, the pinout assembly 62 can extend away from the fourth POL assembly 54 further than the height of the first or second connectors 64, 66 to ensure the pinout assembly 62 is reachable by a pinout connector (not shown).

The set of POL assemblies 48, 50, 52, 54 can include replaceable building blocks or tiles having a substantially similar underlying form factor (e.g. footprint, or common connections), that can thus offer low cost manufacturability and interactive placement for a POL module assembly. Common or reusable form factors can further result in higher process or manufacturing yields, and different module configuration without significant design change. In addition, the POL module assembly comprising a set of the POL assemblies 48, 50, 52, 54 is repairable as a failed POL can replaced with another POL tile, whereas a conventional wire bond-based assembly is simply scrapped at higher costs and expense. Furthermore, while the aspects of FIG. 2 illustrate different pinout assemblies 46, 62, any described pinout assembly can be included in any POL assembly.

Figure 3:
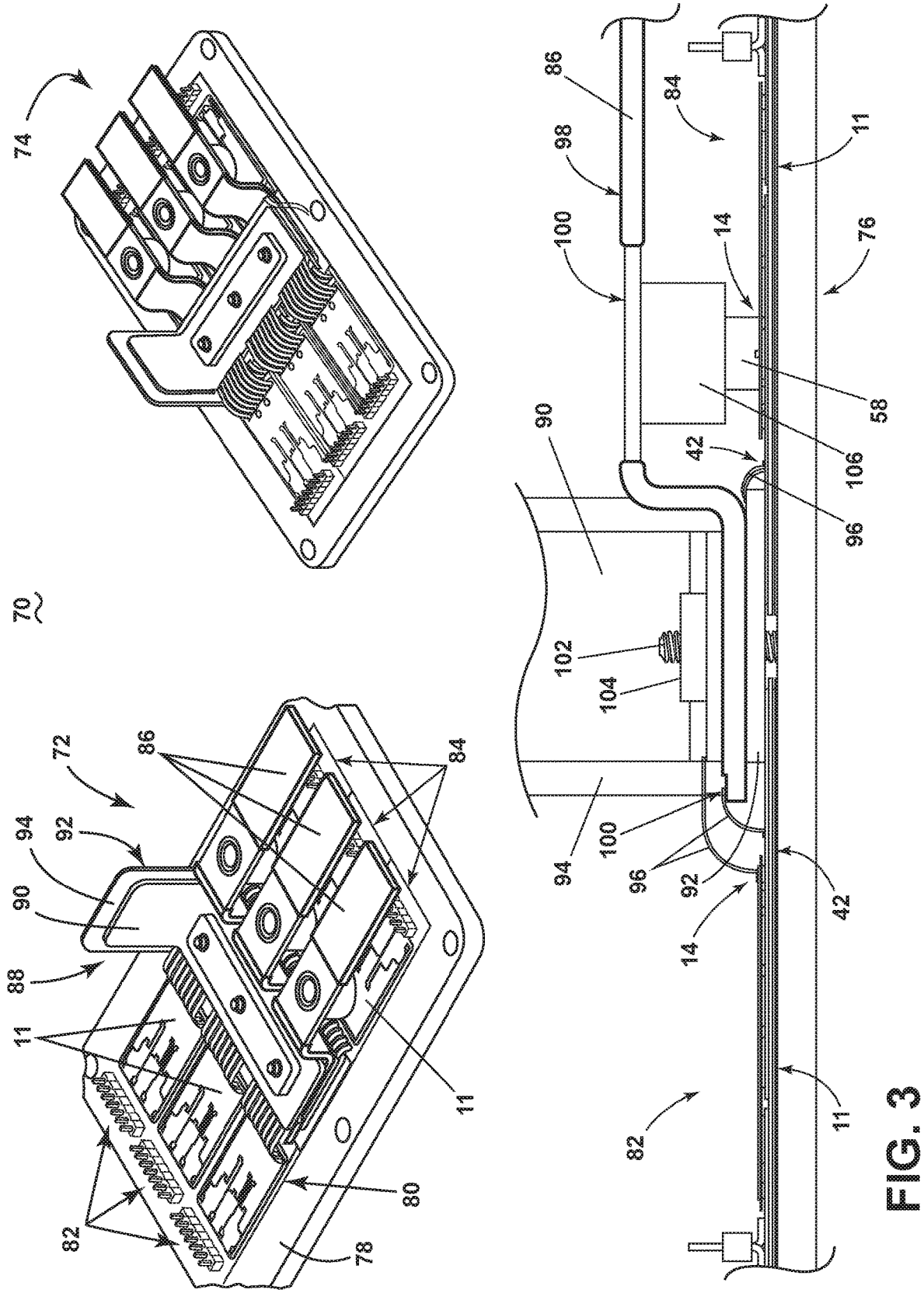
FIG. 3 illustrates a set of views of a first POL module assembly, in accordance with various aspects described herein.

FIG. 3 illustrates a non-limiting example of a first POL module assembly 70 comprising a set of the POL assemblies 48, 50, 52, 54 assembled in a base 78. In one example, the base 78 can be non-conductive, and can have POL assembly seats 80 sized, shaped, or the like, to receive the set of POL assemblies 48, 50, 52, 54. In another non-limiting example, the set of POL assemblies 48, 50, 52, 54 can be fixed relative to the base 78. A first view 72 illustrates a first isometric view of the first POL module assembly 70, a second view 74 illustrates a second isometric view of the first POL module assembly 70, and a third view 76 illustrates a side view of the first POL module assembly 70, for understanding. For the reader's understanding, not all illustrated aspects of the first POL module assembly 70 will be illustrated or duplicated in each of the drawings views 72, 74, 76.

As shown, the first POL module assembly 70 can include a three phase module assembly, having a direct current (DC) input 88 and a three phase alternating current (AC) output (shown as three bus bars 86). The base 78 can be configured or adapted to receive a first set of three POL assemblies 48, 50, 52, 54 (i.e. "lower switches" 82). The base 78 can further be configured or adapted to receive a second set of three POL assemblies 48, 50, 52, 54 (i.e. "upper switches" 84; shown underlying the bus bars 86 in the first view 72 of FIG. 3. As best seen in the first view 72, the DC input 88 includes a second non-conductive layer 94 separating a first conductive layer 90 from a second conductive layer 92 (the second conductive layer 92 positioned behind the second non-conductive layer 94, and further shown in FIG. 8).

In one non-limiting example, the first conductive layer 90 can receive a first voltage (shown as "−V" or "minus V" in the third view 76) and the second conductive layer 92 can receive a second voltage (shown as "+V" or "plus V" in the third view 76), different from the first voltage. Each of the first conductive layer 90, the second conductive layer 92, and the second non-conductive layer 94 can have a continuous first and second portions, wherein the first portion extends normally away from the base 78 that transitions to the second portion extending parallel with the base 78 and separating the upper switches 84 from the lower switches 86.

As best seen in the third view 76, the set of bus bars 86 can include a non-conductive layer 98 (darker in color) overlying a conductor that is exposed at conductive openings 100. The non-conductive portions of the set of bus bars 86 can also separate the first conductive layer 90 from the second conductive layer 92 in a center layering portion of the first POL module assembly 70. Center layering portion of the first POL module assembly 70 can be fixed by, for example, a mechanical fastener, such as a screw interface 102, a mounting block 104, or a combination thereof.

As shown, the first conductive layer 90 can be conductively connected, for example, by way of ribbon connectors 96, to the top conductive surface 14 or source terminal of the set of lower switches 82. The set of lower switches 82 can further be connected with a conductive opening 100 of the respective set of bus bars 86 at the conductive surface 42 or the drain terminal of the POL assembly 48, 50, 52, 54, by way of, for example, ribbon connectors 96. In this sense, the set of lower switches 82 can be controllably operated (by way of the respective pinout assemblies 46, 56), to controllably deliver current received at the first conductive layer 90 to the source terminal, and when the respective lower switch 82 is "ON", conduct current from the source terminal to the drain terminal, and to the respective bus bar 86.

The set of upper switches 84 can include a conductive connector, such as the first post 58, at the top conductive surface 14 or source terminal, while the conductive surface 42 or the drain terminal is further electrically connected with the second conductive layer 92, for example, by way of ribbon connectors 96. The first post 58 can be further connected with a conductive opening 100 of the respective bus bar 86 by way of another conductive connector configured to meet, mate with, or otherwise conductively contact the first post 58. In the illustrated example, the set of bus bars 86 can include a low stress bus bar connector 106 conductively connected with the conductive opening 100, which will be further described with respect to FIG. 5. In this sense, the set of upper switches 84 can be controllably operated (by way of the respective pinout assemblies 46, 56), to controllably deliver current received at the second conductive layer 92 to the source terminal, and when the respective upper switch 84 is "ON", conduct current from the source terminal to the drain terminal, through the first post 58 and low stress bus bar connector 106 to the respective bus bar 86.

As described, the first POL module assembly 70 can operate by way of the respective sets of upper and lower switches 82, 84 to controllably invert a DC input 88 to a three phase AC output delivered to the set of bus bars 86, by one having skill in the art. Aspects of the first POL module assembly 70 can result in a highly compacted three phase converter module with an AC output and a pair of DC inputs. The three AC bus bars are sandwiched between two DC bus bars to minimize inductance. The connection between the first post 58 and the low stress bus bar connector 106 allows for lower stress and low impedance. The decrease in these stress and impedance values allows the module to deliver high power density with much lower losses than conventional converter modules.

Figure 4:
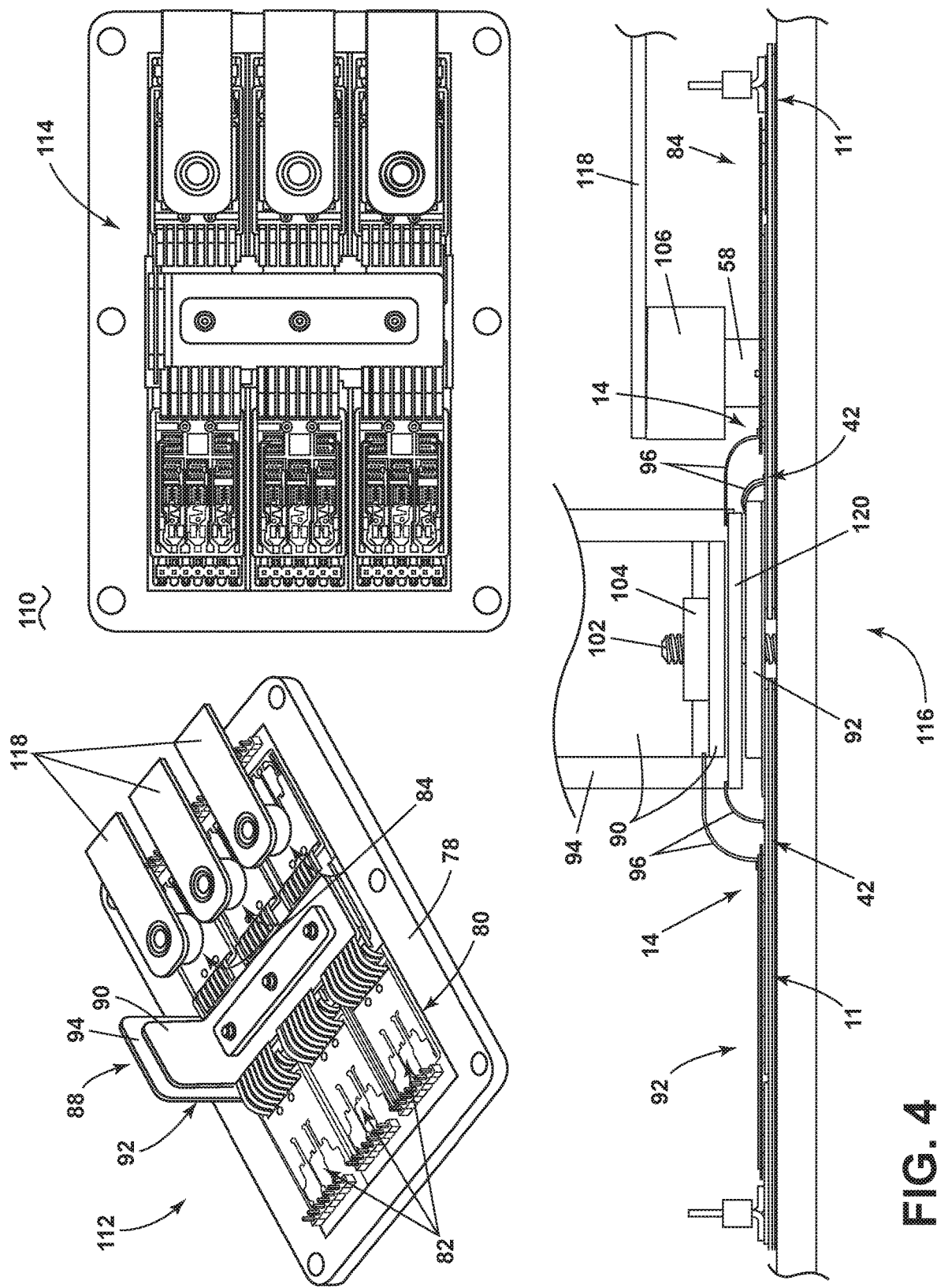
FIG. 4 illustrates a set of views of a second POL module assembly, in accordance with various aspects described herein.

FIG. 4 illustrates another non-limiting example of a second POL module assembly 110 comprising a set of the POL assemblies 48, 50, 52, 54 assembled in the base 78. The second POL module assembly 110 can be similar to the first POL module assembly 70; therefore, like parts will be identified with like numerals, with it being understood that the description of the like parts of the first POL module assembly 70 applies to the second POL module assembly 110, unless otherwise noted. The second POL module assembly 110 is illustrated in a first isometric view 112, a second top-down view 114, and a third side view 116, for understanding. For the reader's understanding, not all illustrated aspects of the second POL module assembly 110 will be illustrated or duplicated in each of the drawings views 112, 114, 116.

The second POL module assembly 110 can include another set of bus bars 118, different from the set of bus bars 86 of the first POL module assembly 70. As shown, the set of bus bars 118 of the second POL module assembly 110 can optionally not include the non-conductive coating, and can be connected with the first post 58 of the set of upper switches 84 by the low stress bus bar connector 106. Additionally, the first conductive layer 90 and the second conductive layer 92 can be non-conductively isolated from one another by a conductive element 120, as seen in the third view 116. In non-limiting examples, the conductive element 120 can include a non-conductive external layer, coating, or the like, or the first and second conductive layers 90, 92 can be spaced from the conductive element 120 (for example by non-conductive spacers) to provide an air gap or to prevent conductive contacting. As shown, the conductive element 120 can be conductively connected with the conductive surface 42 or the drain terminal of the set of lower switches 82, and can be further conductively connected with the top conductive surface 14 or source terminal of the set of upper switches 82. In the illustrated example, the connections of the conductive element 120 can include ribbon connectors 96.

Aspects of the second POL module assembly 110 design or configuration allow for or enable a highly compact three phase module with an AC output and a pair of DC inputs. The three AC bridge bus bars 118 are sandwiched between two DC conductive layers 90, 92 to minimize inductance and are ribbon bonded (via ribbon connectors 96) to the drain of lower switch 82 and source of upper switch 84, respectively. The three AC output bus bars 118 can be soldered to the spring assemblies (e.g. the low stress bus bar connector 106) and then inserted over the first post 58 or pin assembly that is soldered to the respective POL component 11, which allows for low stress and low impedance. This design allows the module to deliver high power at each phase and able to disassembly for repairing.

Figure 5:
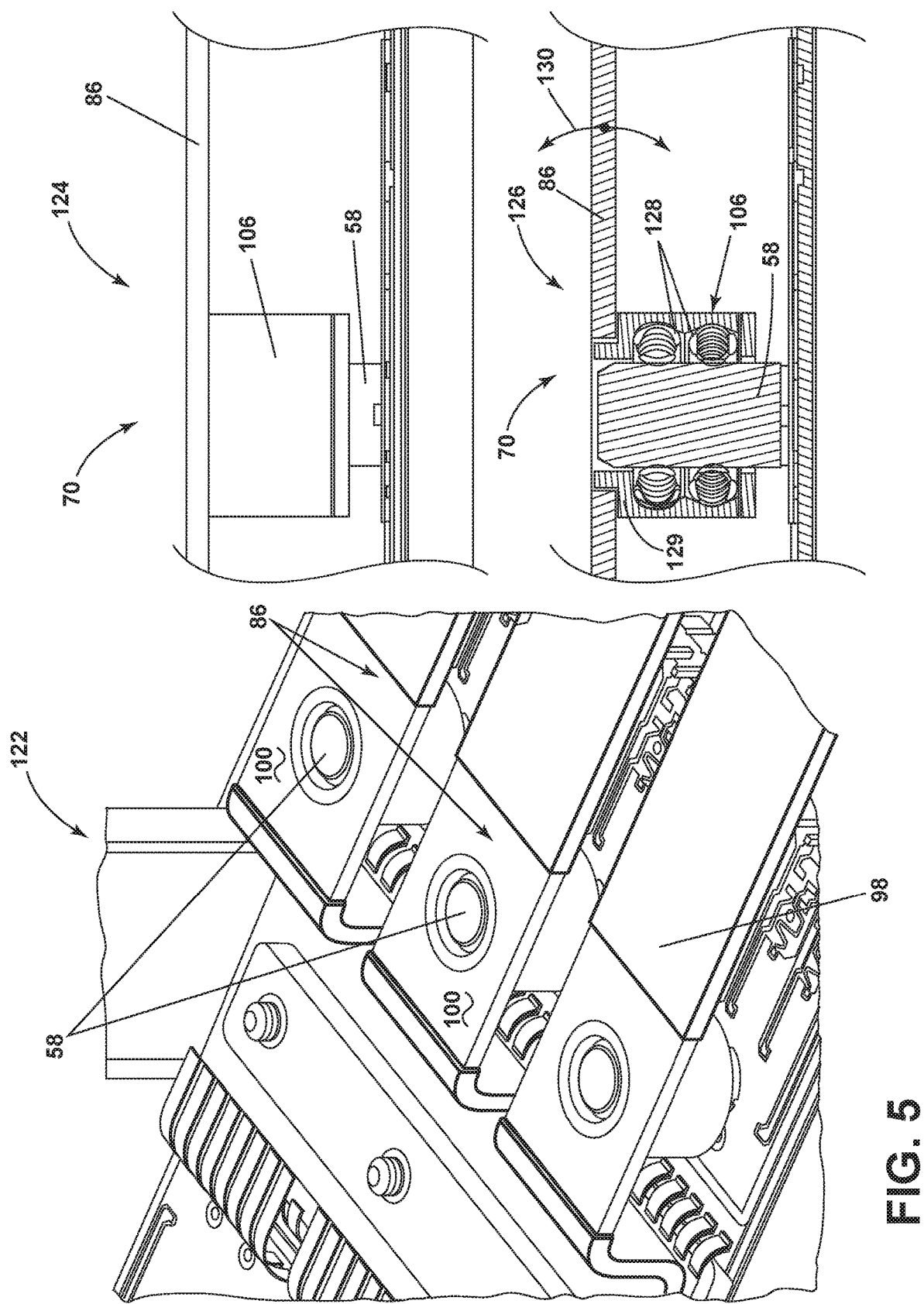
FIG. 5 illustrates a set of view of a low stress bus bar connector utilized in any of the POL module assemblies, in accordance with various aspects described herein.

FIG. 5 illustrates a set of zoomed views of the low stress bus bar connector 106, in accordance with aspects of the disclosure. An isometric zoomed view of a set of bus bars 86 is shown in the first view 122, a zoomed side view of the first POL module assembly 70 is shown in the second view 124, and a cross-sectional view of the first POL module assembly 70 and low stress bus bar connector 106 is shown in the third view 126. As shown, for example in the third view 126, the low stress bus bar connector 106 can house, contain, or otherwise include at least one flexible conductive interface, such as a set of springs 128, in a housing 129. The set of springs 128 can be sized, shaped, or otherwise selected to compressively or flexibly interact with the first post 58, such that a conductive connection is established between the first post 58, through the set or a subset of the springs 128, and through the housing 129, to the set of bus bars 86. In non-limiting examples, the low stress bus bar connector 106 can be soldered or otherwise conductively fixed to the respective bus bar 86. While FIG. 5 illustrates and describes bus bars 86 and the first POL module assembly 70, non-limiting aspects of the low stress bus bar connector 106 can be included with the set of bus bars 118 of FIG. 4, the second POL module assembly 110, or any combination of components 70, 86, 110, 118.

In non-limiting aspects of the disclosure, the inclusion of the low stress bus bar connector 106 can prevent or reduce the mechanical stress of the bus bar 86, 118 to the POL component 11 or the POL module assembly 70, 110. For example, bus bars 86, 118 can be stressed, jostled, or otherwise moved relative to the POL component 11 or the POL module assembly 70, 110 during assembly, installation, or due to operating environment effects (e.g. vibrations, etc.). An example schematic movement is show as arrows 130. The movement 130 or forces that are exerted on the set of bus bars 86, 118 is transferred to the set of flexible springs 128 to protect or prevent stress damage to the POL component 11. The set of springs 128 allow or enable the bus bars 86, 118 to flex and distribute the vibration away from the POL components 11 underneath. In another non-limiting example, the low stress bus bar connector 106 can enable or allow for independent movement of the set of bus bars 86, 118 during vibration events.

Figure 6:
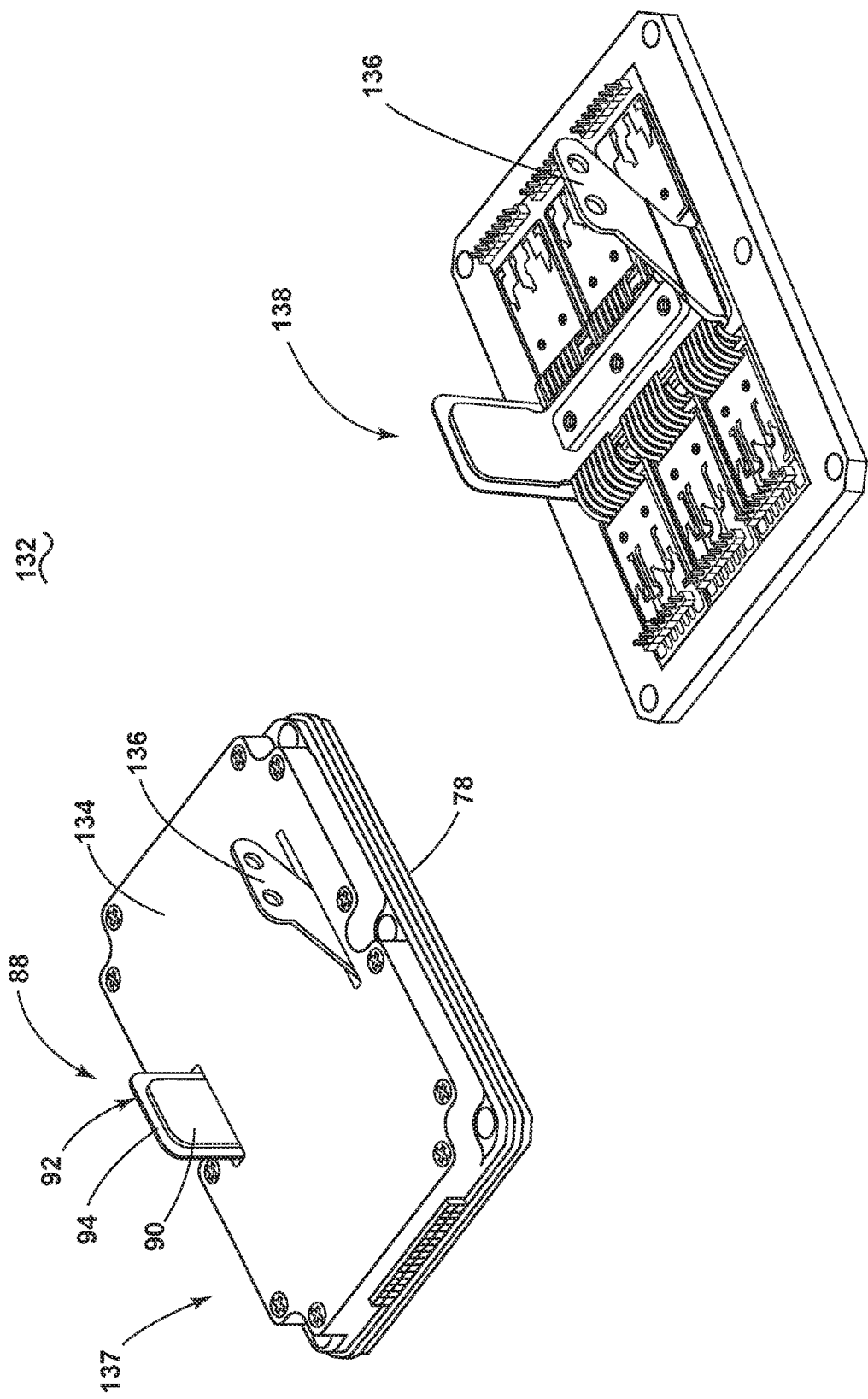
FIG. 6 illustrates a first set of views of a third POL module assembly, in accordance with various aspects described herein.
Figure 7:
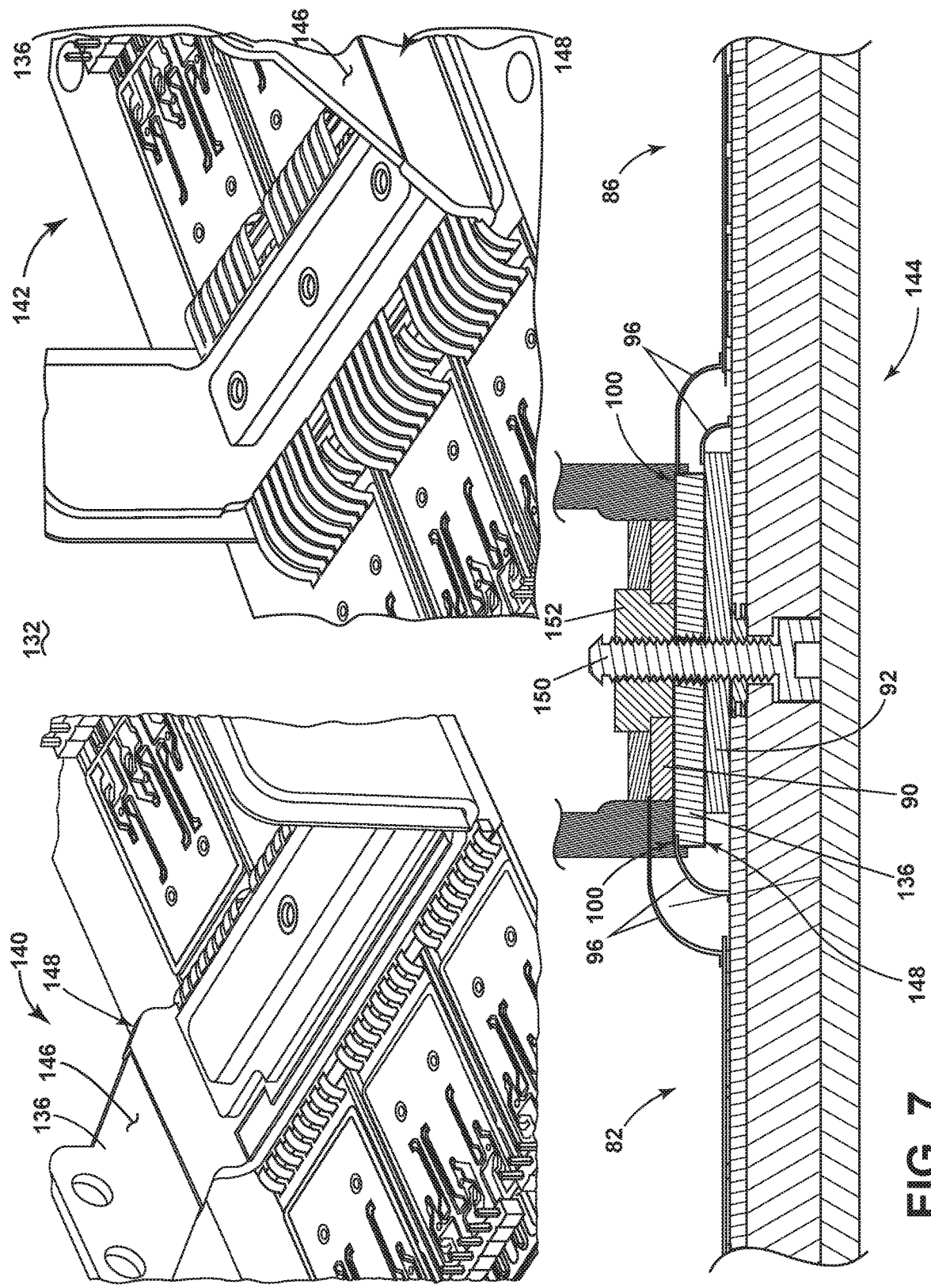
FIG. 7 illustrates a second set of views of the third POL module assembly, in accordance with various aspects described herein.

FIGS. 6 and 7 illustrate another non-limiting example of a third POL module assembly 132. The third example POL module assembly 132 can be similar to the first and second POL module assemblies 70, 118; therefore, like parts will be identified with like numerals, with it being understood that the description of the like parts of the first and second POL module assemblies 70, 118 applies to the third example POL module assembly 132, unless otherwise noted. The third POL module assembly 132 is illustrated in a first isometric view 136 with a cover 134, a second isometric view 138 without a cover, a third zoomed isometric view 140, a fourth zoomed isometric view 142 from a perspective opposite of the third view 140, and a fifth size view 144, for understanding. For the reader's understanding, not all illustrated aspects of the third POL module assembly 132 will be illustrated or duplicated in each of the drawings views 136, 138, 140, 142, 144.

Non-limiting aspects of the third POL module assembly 132 can include a low inductance, high power, half bridge power converter module. As shown in the first view 136, the third POL module assembly 132 can include the direct current (DC) input 88 and a single phase AC output 136 extending external to a module cover 134. In one non-limiting example, the cover 134 can be attached to the base 78. As shown in the third view 140, the AC output 136 can include a conductive surface 146 over a connector portion of the output 136, and a non-conductive surface 148 (darker in color, as shown) over another portion of the output 136. The non-conductive surface 148 can, for example, insulate the AC output 136 from each respective first and second conductive layers 90, 92, while allowing for conductive openings 100 for ribbon connectors 96. As shown in the fifth view 144, the layering of the first and second conductive layers 90, 92, and the AC output 136 can be fixed relative to the third POL module assembly 132, for example, by way of non-conductive a mechanical fastener, such as a screw interface 150, a mounting block 152, or a combination thereof.

The low inductance laminated bus bars (AC and DC) with ribbon bond attached to POL component 11 of the third POL module assembly 132 allows for or enables lower inductance and impedance for the assembly 132. The AC output 136 or AC bus bar can be sandwiched between the two DC bus bars 90, 92 to minimize inductance. This build structure allows the module to parallel multiple POL components 11 to deliver higher power density with much lower losses than conventional power converter modules.

FIG. 8 illustrates further aspects of the DC input 88. A first view 154 illustrates an isometric view of the DC input 88, while a second view 156 illustrates a side view of the DC input 88, wherein the layering of the first conductive layer 90, the second non-conductive layer 94, and the second conductive layer 92 are assembled.

Non-limiting aspects of the DC input 88 design structure provide or enable low inductance. Conventional bus bar structures attach via wire or ribbon bonds, then to a terminal. The DC input 88 connector attaches directly to the POL components 11 and allows the modules 70, 118, 132 to provide improved performance due to lower inductance and lower impedance. Additionally, the DC input 88 connection also allows for a more robust integration technique by clamping the DC input 88 "blade" to an external bus bar.

Figure 9:
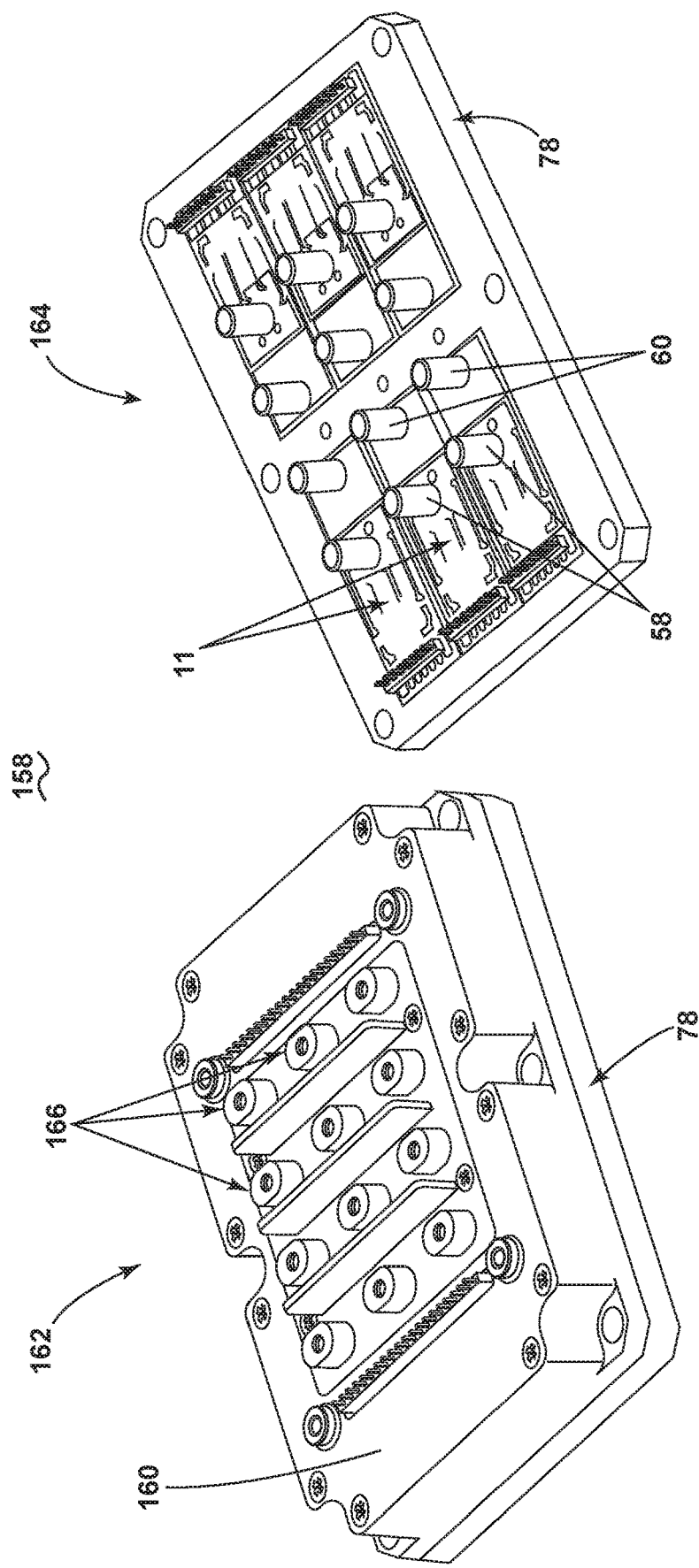
FIG. 9 illustrates a first set of views of a fourth POL module assembly, in accordance with various aspects described herein.
Figure 10:
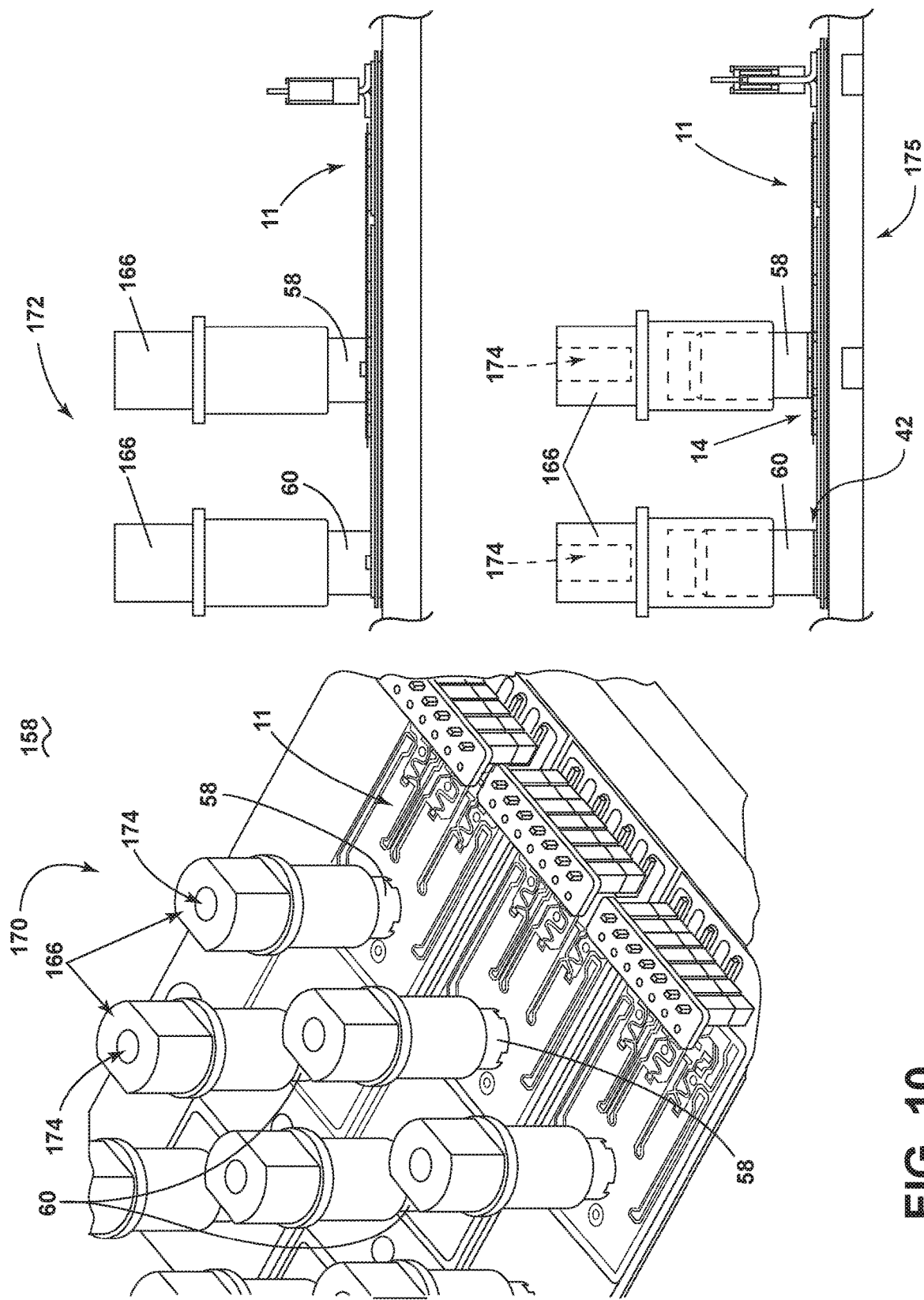
FIG. 10 illustrates a second set of views of the fourth POL module assembly, in accordance with various aspects described herein.

FIGS. 9 and 10 illustrate a fourth POL module assembly 158 that can be reconfigurable to provide a selectable or configurable switch count, terminal inputs or outputs, or operable converter topography. The fourth example POL module assembly 158 can be similar to the first, second, and third POL module assemblies 70, 110, 132; therefore, like parts will be identified with like numerals, with it being understood that the description of the like parts of the first, second, and third POL module assemblies 70, 110, 132 applies to the fourth example POL module assembly 158, unless otherwise noted. The fourth POL module assembly 158 is illustrated in a first isometric view 162 with a cover 160, a second isometric view 164 without the cover 160, in a third zoomed isometric view 170, in a fourth size view 172, and in a fifth cross-sectional view 175, for understanding. For the reader's understanding, not all illustrated aspects of the fourth POL module assembly 158 will be illustrated or duplicated in each of the drawings views 112, 114, 116.

As shown in the first view 162, the fourth POL module assembly 158 can include a set of termination inputs and outputs 166 that extend external to a module cover 160. In one non-limiting example, the module cover 160 can be attached to the base 78. The second view 164 without the module cover 160 illustrates that a set of POL components 11 having a respective first base 58 and second base 60 can correspond with the set of termination inputs and outputs 166. The third view 170 illustrates how the respective set of termination inputs and outputs 166 can be received at or overlie the corresponding first or second bases 58, 60. The third view 170 further illustrates that the set of termination inputs and outputs 166 can include or receive a mechanical connector at an aperture 174, as desired.

The fourth view 172 and the fifth view 175 demonstrate that each respective termination input or output 166 is received over the first or second base 58, 60 in a conductive relationship. In one non-limiting example, the conductive relationship can include a set of conductive fingers ensuring conductive contact between the input or output 166 and the respective base 58, 60. In this sense, non-limiting aspects of the fourth POL module assembly 158 can allow for or enable a reconfigurable power converter module by selectively configuring or connecting the set of termination inputs and outputs 166 as desired to utilize the corresponding set of POL components 11.

For instance, the fourth POL module assembly 158 assembled with the module cover 160 can receive a selected set of connectors (not shown) positioned external to the cover 160 but interconnecting the set of termination inputs and outputs 166 such that the fourth POL module assembly 158 operates as desired. One skilled in the art will understand that, for example, a set of six POL components 11 can be configured at the set of termination inputs and outputs 166 such that the fourth POL module assembly 158 operates as a half bridge, a three phase module, a two phase module, six independent switches in a module, or the like. Thus, non-limiting aspects of the fourth POL module assembly 158 allow for or enable multiple selectable and reconfigurable POL or converter configurations in a single POL module assembly 158.

Non-limiting benefits to the interconnections between the termination input and outputs 166 received over the first or second base 58, 60 of the fourth POL module assembly 158 can assist in isolation of mechanical strain on the POL components 11. Any mechanical stresses in this example will be transferred to the contact between the termination input and outputs 166 and the first or second base 58, 60, such as the finger contact, to protect the POL components 11. The finger contact assemblies allow the bus bars to flex and distribute the vibration away from the POL structure underneath, including allowing for independent movement between the respective connections, such as during vibration events.

Figure 11:
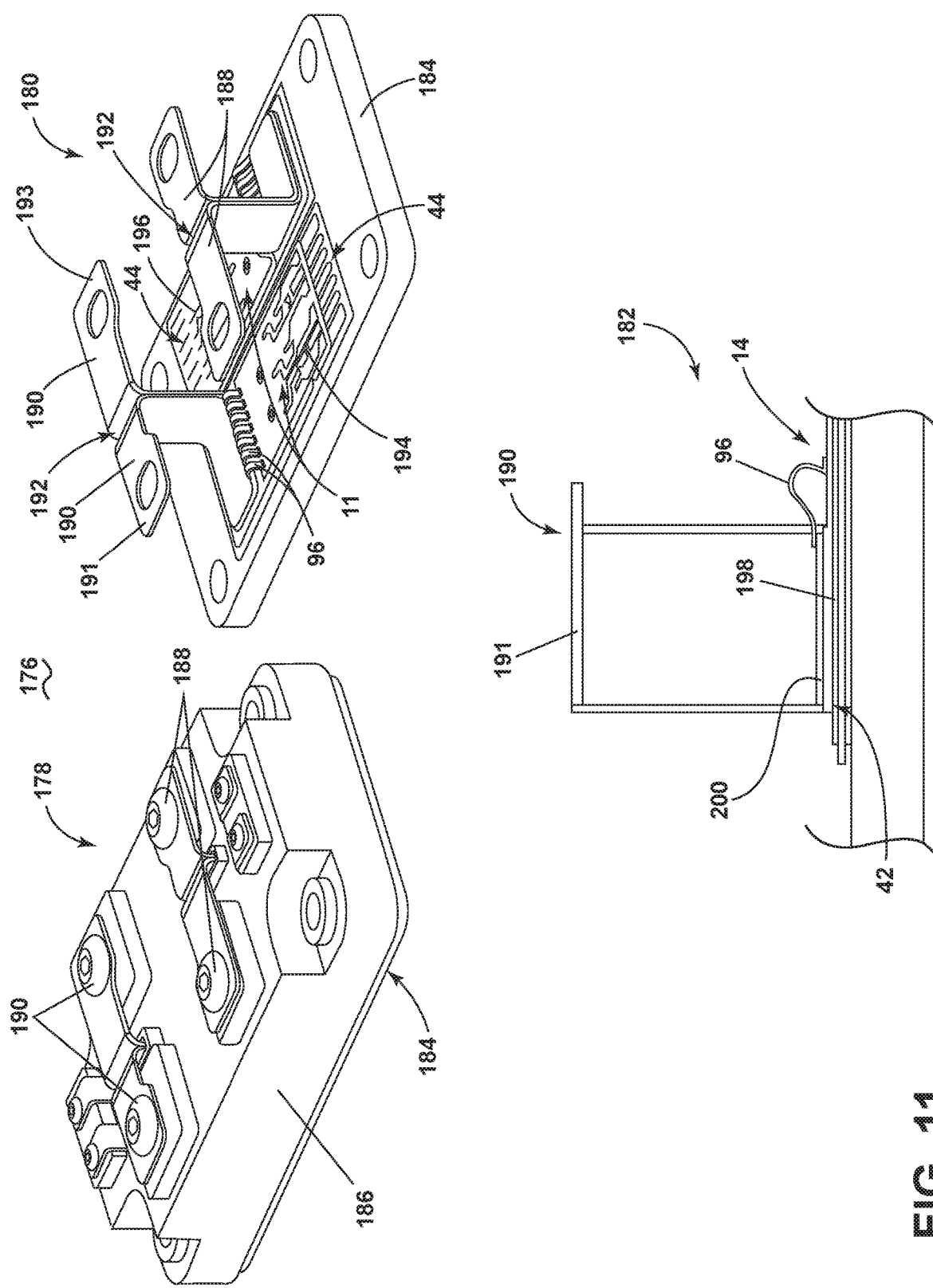
FIG. 11 illustrates a set of views of a fifth POL module assembly, in accordance with various aspects described herein.

FIG. 11 illustrates a fifth POL module assembly 176, in accordance with aspects of the disclosure. The fifth POL module assembly 176 is illustrated in a first isometric view 178 with a module cover 186, in a second isometric view 180 without the module cover 186, and in a third zoomed side view 182, for understanding. The fifth POL module assembly 176 can include a base 184, similar to the previously described base 78, but configured to receive two POL components 11. As shown a first POL component 194 is arranged lengthwise along the base 184 next to a second POL component 196. In the illustrated example, the first and second POL components 194, 196 are oppositely oriented (e.g. "head-to-toe," or wherein the set of terminals 44 are arranged at opposite ends, relative to the other POL component 194, 196).

Extending away from the planar surface of the first POL component 194 are a first set of connectors 190, shown as a first connector 191 and a second connector 193. The first and second connectors 191, 193 can be configured or adapted, for example, to receive a mechanical screw-type interface for conductively connecting with the respective source terminal (first connector 191) and drain terminal (second connector 193) of the first POL component 194. Additionally, the first POL component 194 is shown to include a non-conductive layer 192 disposed between normally extending arm segments of the respective first and second connectors 191, 193 to prevent conductive contact between the connectors 191, 193, while allowing the arm segments to non-conductively abut each other, for example, for strength or rigidity relative to the first POL component 194.

As shown, the first connector 191 can overly at least a portion of the first POL component 194, while the second connector 193 can overly at least a portion of the second POL component 196. Also as shown in the third view 182, the first connector 191 is electrically connected with the top conductive surface 14 or source terminal of the first POL component 194 by way of a first conductive surface 200 connected by a set of ribbon connectors 96. The second connector 193 (not shown in the third view) is electrically connected with the conductive surface 42 or the drain terminal of the first POL component 194 by way of a second conductive surface 198 directly contacting the conductive surface 42. In one non-limiting example, the first and the second conductive surfaces 200, 198 are isolated from one another, for example, by the non-conductive layer 192. In another non-limiting example, the conductive surfaces 198, 200 can be on-conductively laminated together.

The aforementioned aspects of the first POL component 194 are also applicable to the second POL component 194 and a set of second connectors 188, but in a reverse orientation, as shown. The applicable aspects are not duplicated here, for brevity. Non-limiting aspects of the fifth POL module assembly 176 ensures high reliability, high current, high voltage and easy assembly of the components within the module assembly 176. In this sense, the fifth POL module assembly 176 allows for or enables modules to be smaller and have a greater power density in a smaller area than conventional modules. The ribbon connectors 96 also allows for stress relief between the first conductive surface 200 and first POL component 194, which allows for enhanced reliability.

Figure 12:
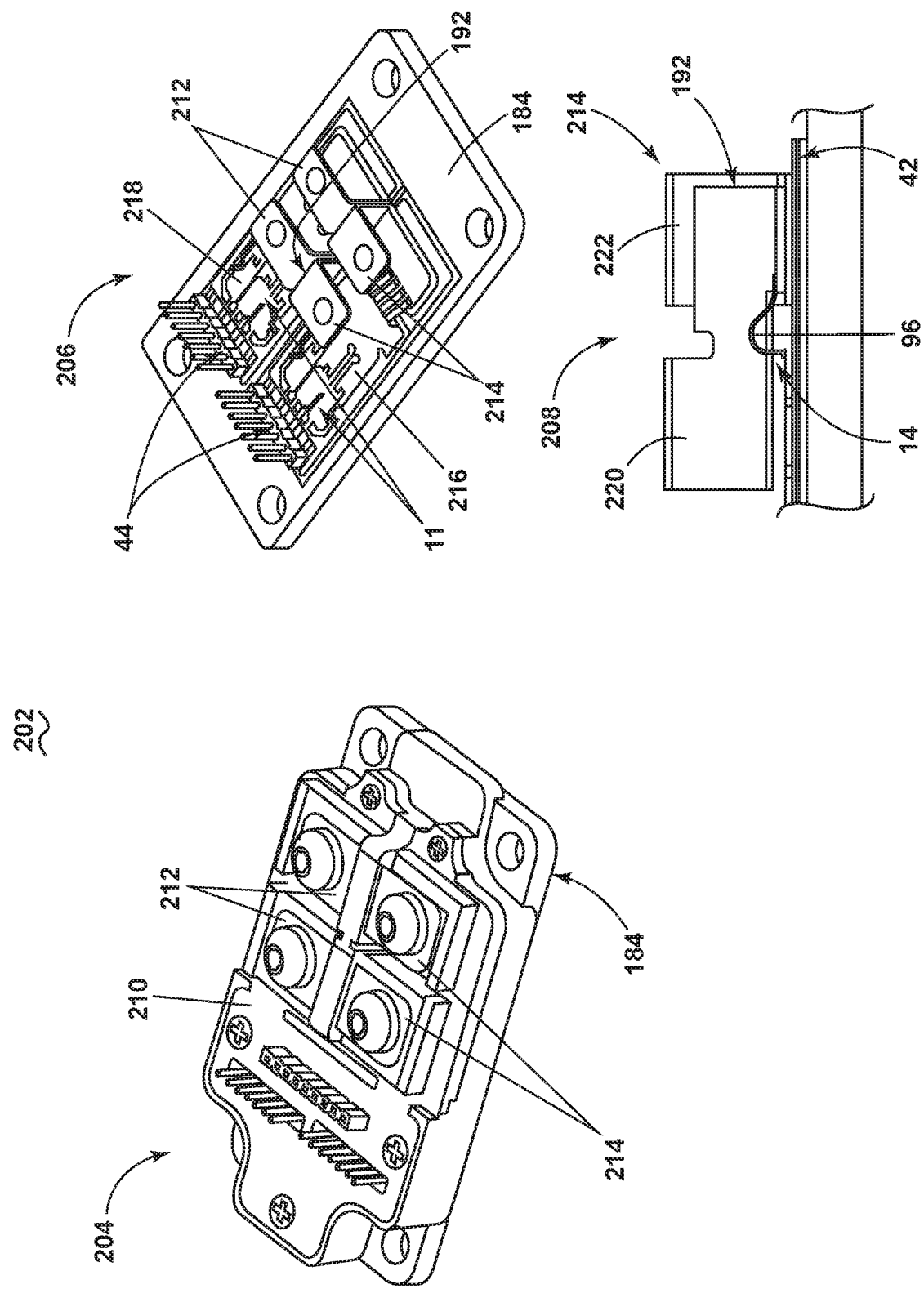
FIG. 12 illustrates a set of views of a sixth POL module assembly, in accordance with various aspects described herein.

FIG. 12 illustrates a sixth POL module assembly 202, in accordance with aspects of the disclosure. The sixth POL module assembly 202 can be similar to the fifth POL module assembly 176; therefore, like parts will be identified with like numerals, with it being understood that the description of the like parts of the fifth POL module assembly 176 applies to the sixth POL module assembly 202, unless otherwise noted. The sixth POL module assembly 176 is illustrated in a first isometric view 204 with a module cover 210, in a second isometric view 206 without the module cover 210, and in a third zoomed side view 208, for understanding. As seen, the sixth POL module assembly 202 can include a set of POL components 11, shown as a first POL component 216 and a second POL component 218, aligned or oriented in a similar fashion (e.g. "head-to-head," or wherein the set of terminals 44 are arranged at the same ends, relative to the other POL component 216, 218).

Extending away from the planar surface of the first POL component 216 are a first set of connectors 214, shown as a first connector 220 and a second connector 222. The first and second connectors 220, 222 can be configured or adapted, for example, to receive a mechanical screw-type interface for conductively connecting with the respective source terminal (first connector 220) and drain terminal (second connector 222) of the first POL component 214. Additionally, the first POL component 216 is shown to include a non-conductive layer 192 disposed between normally extending arm segments of the respective first and second connectors 220, 222 to prevent conductive contact between the connectors 220, 222 while allowing the arm segments to non-conductively abut each other, for example, for strength or rigidity relative to the first POL component 214. Additionally, non-conductive layers 192 can be disposed between arm segments of the first set of connectors 214 of the first POL component 216 and a second set of connectors 212 of the second POL component 218.

As shown, the first connector 220 can overly at least a portion of the first POL component 216, while the second connector 222 can overly at least another portion of the first POL component 216. Stated another way, the first and second connectors 220, 222 are axially spaced along a longitudinal axis of the first POL component 216. Also as shown in the third view 208, the first connector 220 is electrically connected with the top conductive surface 14 or source terminal of the first POL component 216 by way of a set of ribbon connectors 96. The second connector 222 is electrically connected with the conductive surface 42 or the drain terminal of the first POL component 216 by way of a second conductive surface directly contacting the conductive surface 42. In one non-limiting example, the first and the second conductive surfaces 220, 222 are isolated from one another, for example, by the non-conductive layer (not shown).

The aforementioned aspects of the first POL component 216 are also applicable to the second POL component 218 and the set of second connectors 212, as shown. The applicable aspects are not duplicated here, for brevity. Non-limiting aspects of the sixth POL module assembly 202 ensures high reliability, high current, high voltage and easy assembly of the components within the module assembly 202. In this sense, the sixth POL module assembly 202 allows for or enables modules to be smaller and have a greater power density in a smaller area than conventional modules. The ribbon connectors 96 also allows for stress relief between the first conductive surface 220 and first POL component 216, which allows for enhanced reliability.

Figure 13:
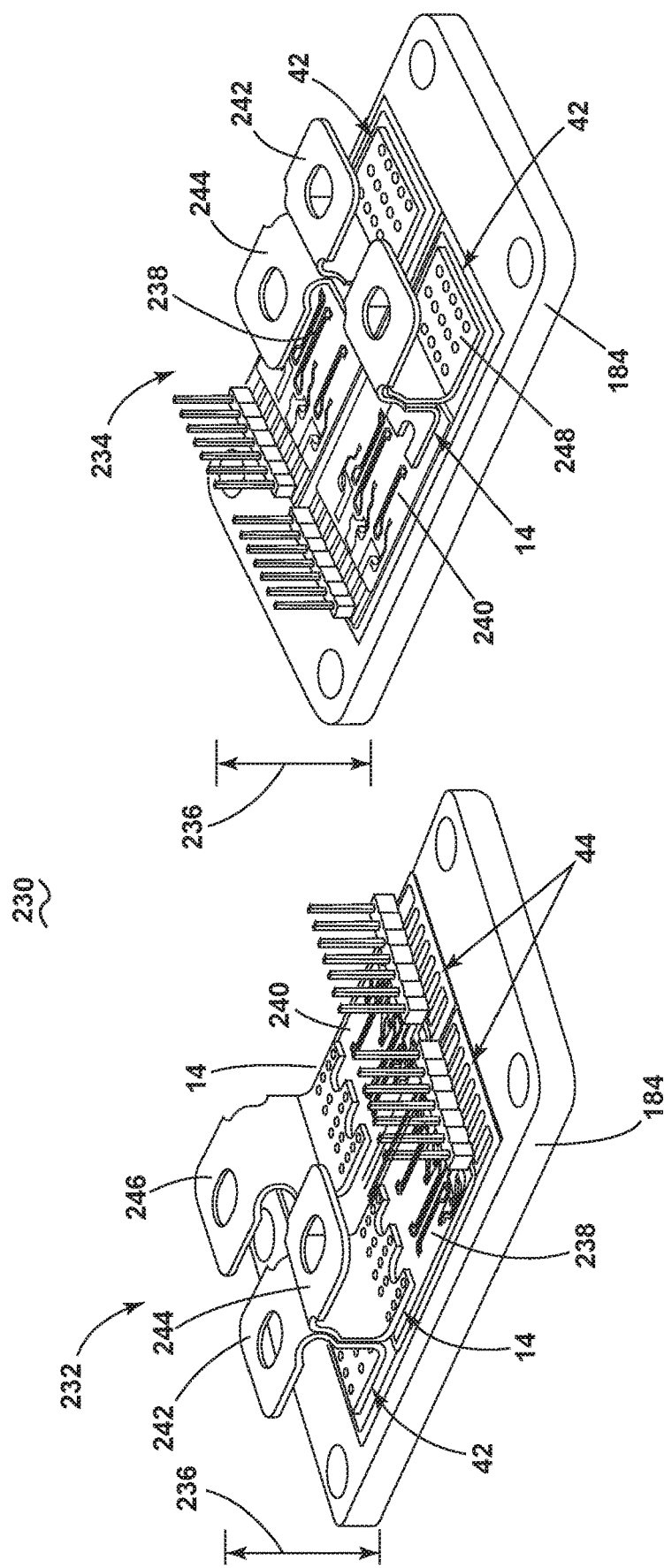
FIG. 13 illustrates a first set of views of a seventh POL module assembly, in accordance with various aspects described herein.
Figure 14:
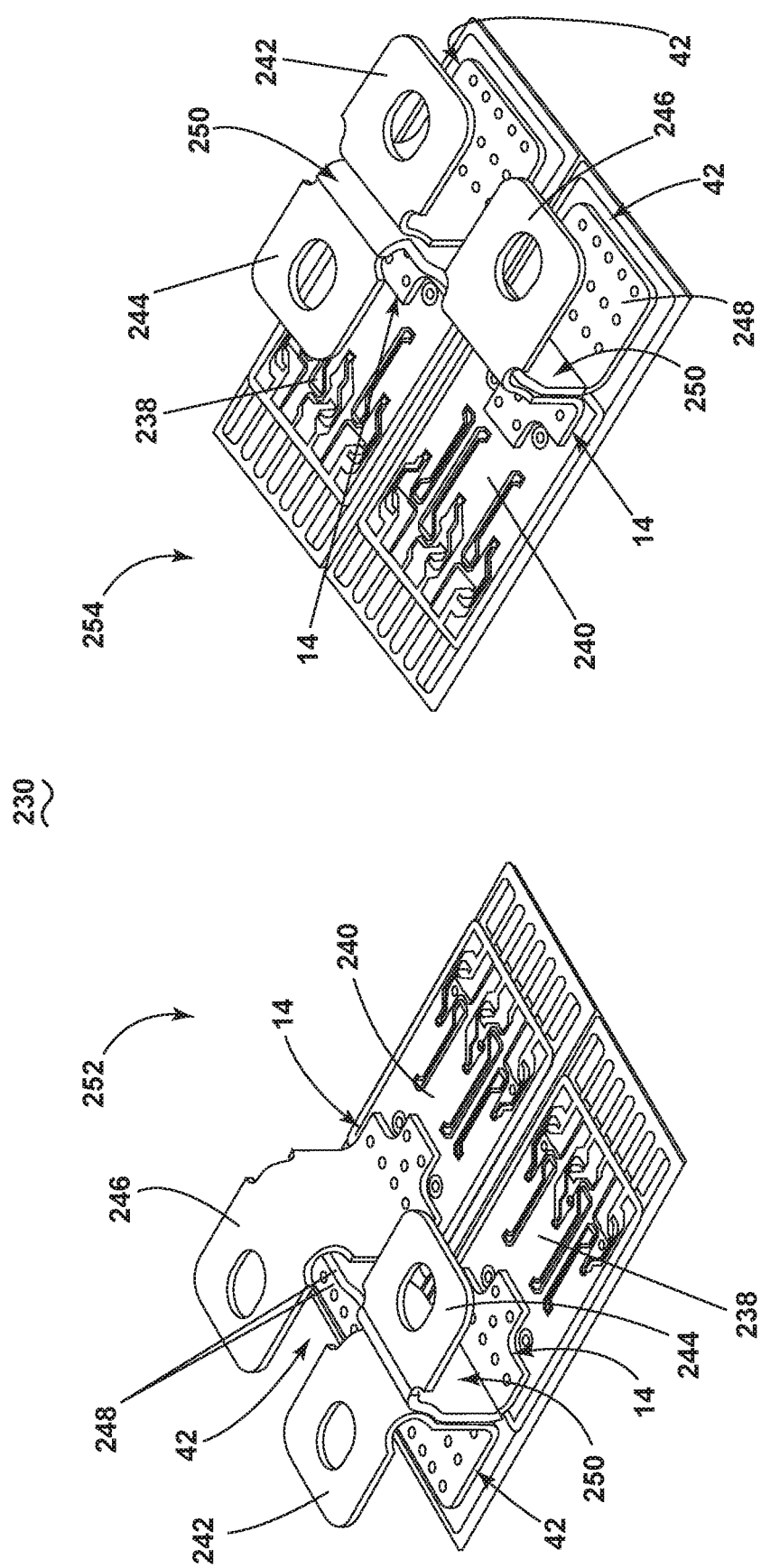
FIG. 14 illustrates a second set of views of the seventh POL module assembly, in accordance with various aspects described herein.

FIGS. 13 and 14 illustrates a seventh POL module assembly 230, in accordance with aspects of the disclosure. The seventh POL module assembly 230 can be similar to the fifth and sixth POL module assemblies 176, 202; therefore, like parts will be identified with like numerals, with it being understood that the description of the like parts of the fifth and sixth POL module assemblies 176, 202 applies to the seventh POL module assembly 230, unless otherwise noted. The seventh POL module assembly 230 is illustrated in a first isometric view 232 with the base 184, in a second isometric view 234 in the base 184 in a perspective opposite of the second view 232, in a third zoomed isometric view 252 focusing on the seventh POL module assembly 230 without the base, and in a fourth zoomed isometric view 254 in a perspective opposite of the third view 252, for understanding. As seen, the seventh POL module assembly 230 can include a set of POL components 11, shown as a first POL component 238 and a second POL component 240, aligned or oriented in a similar fashion (e.g. "head-to-head," or wherein the set of terminals 44 are arranged at the same ends, relative to the other POL component 238, 240).

The first POL component 238 can include a first connector 244 soldered or fixedly attached to the top conductive surface 14 or source terminal and a second connector 242 soldered or fixedly attached to the conductive surface 42 or the drain terminal. The first and second connectors 244, 242 can be configured or adapted, for example, to receive a mechanical screw-type interface for conductively connecting with the respective source terminal and drain terminal of the first POL component 238. Additionally, the first POL component 238 can include a non-conductive layer 250 disposed between normally extending arm segments of the respective first and second connectors 244, 242 to prevent conductive contact between the connectors 244, 242 while allowing the arm segments to non-conductively abut each other, for example, for strength or rigidity relative to the first POL component 238.

The second POL component 240 can include a third connector 246 soldered or fixedly attached to the top conductive surface 14 or source terminal, and a fourth connector 248 soldered or fixedly attached to the conductive surface 42 or the drain terminal. Additionally, the second POL component 240 can include a non-conductive layer 250 disposed between normally extending arm segments of the respective third and fourth connectors 246, 248 to prevent conductive contact between the connectors 246, 248 while allowing the arm segments to non-conductively abut each other, for example, for strength or rigidity relative to the second POL component 240. In one non-limiting example, the fourth connector 248 of the second POL component 240 can be conductively connected with the first connector 244 of the first POL component 238.

Thus, aspects of the seventh POL module assembly 230 can include a low inductance half bridge power converter module. As shown in the first view 252 and 254, the seventh POL module assembly 230 can include the direct current (DC) input 242 as V+ and 246 as V−, and a single-phase AC output 244. The seventh POL module assembly 230 can further have a reduced height (show as dimension 236 in the first and second views 232, 234), compared with conventional power modules, or the fifth and sixth POL module assemblies 176, 202. Stray inductance within a power module is a combination of the various electrical interconnect elements which includes the semiconductor die, the substrate copper onto which the die is placed, the wire or ribbon bonds used to connect the die to the bus bars and the bus bars themselves. The reduction of stray inductance can achieve higher performance from power module. Aspects of the seventh POL module assembly 230 eliminate all wire ribbon bonds by locating the bus bars directly onto the die and substrate; thus minimizing the electrical path and stray inductance between the die and external circuits. Furthermore, the seventh POL module assembly 230 reduced added inductance by creating a bar structure to shorten (e.g. in the height direction 236) the connection of the terminals 242, 244, 246 for the external connection. This bus bar structure creates a reduced inductance for higher performance of the half bridge module design.

While not illustrated, the lower profile design aspects of the seventh POL module assembly 230 can be equally applied by one skilled in the art to the fifth and sixth POL module assemblies 176, 202, for instance, to reduce inductance or impedance, or to lower the profile height of the assembly 176, 202.

Additionally, non-conductive layers 192 can be disposed between arm segments of the first set of connectors 214 of the first POL component 216 and a second set of connectors 212 of the second POL component 218.

Figure 15:
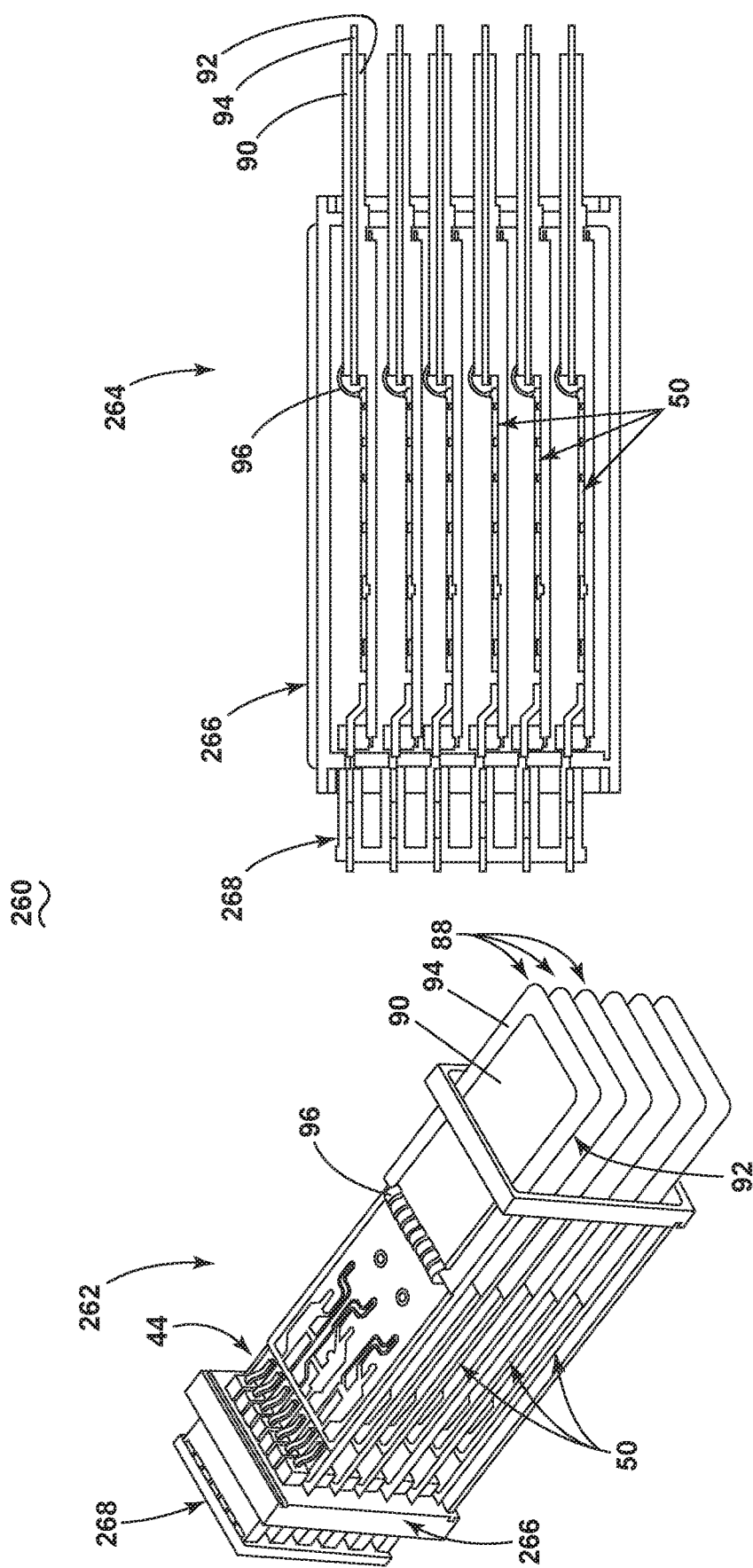
FIG. 15 illustrates a set of views of an eighth POL module assembly, in accordance with various aspects described herein.

FIG. 15 illustrates one non-limiting example of an eighth POL module assembly 260. The eighth POL assembly module 260 can be similar to the POL module assemblies described herein; therefore, like parts will be identified with like numerals, with it being understood that the description of the like parts of the previously described POL module assemblies applies to the eighth POL module assembly 260, unless otherwise noted.

As shown, the eighth POL module assembly 260 can include a set of the second POL assemblies 50 (shown in FIG. 2). FIG. 15 illustrates the eighth POL module assembly 260 in a first isometric view 202 with a housing 266 removed, and a second side view 264 with the housing 266 included, for understanding.

As shown, the set of second POL assemblies 50 can each include a DC input 88 having a first conductive layer 90 and a second conductive layer 92, separated from the first conductive layer 90 by a second non-conductive layer 94. The set of second POL assemblies 50 can be arranged in a substantially similar or parallel arrangement, such that, for example, each DC input 88 is located at a common end of the housing 266 and each pinout assembly 56 or set of terminals 44 is located at a common end or the opposite end of the housing 266. As shown, the set of pinout assemblies 56 can be connected with a common pinout connector 268 for the eighth POL module assembly 260.

Aspects of the eighth POL module assembly 260 can describe a POL "tower" module that significantly reduces the form factor of the POL module assembly 260, while keeping a high power density and allowing multiple output phases. In this sense, the POL assemblies 50 stack up in module assembly 260 as "power folds." This POL folds module design provides solutions that can reduce temperature excursions relative to the mean in a compact package that can be used as a building block for larger assemblies. This module also include integrating a couple size fluid cooling capability with, for example, a 3D-printed sealed frame or housing 266.

Figure 16:
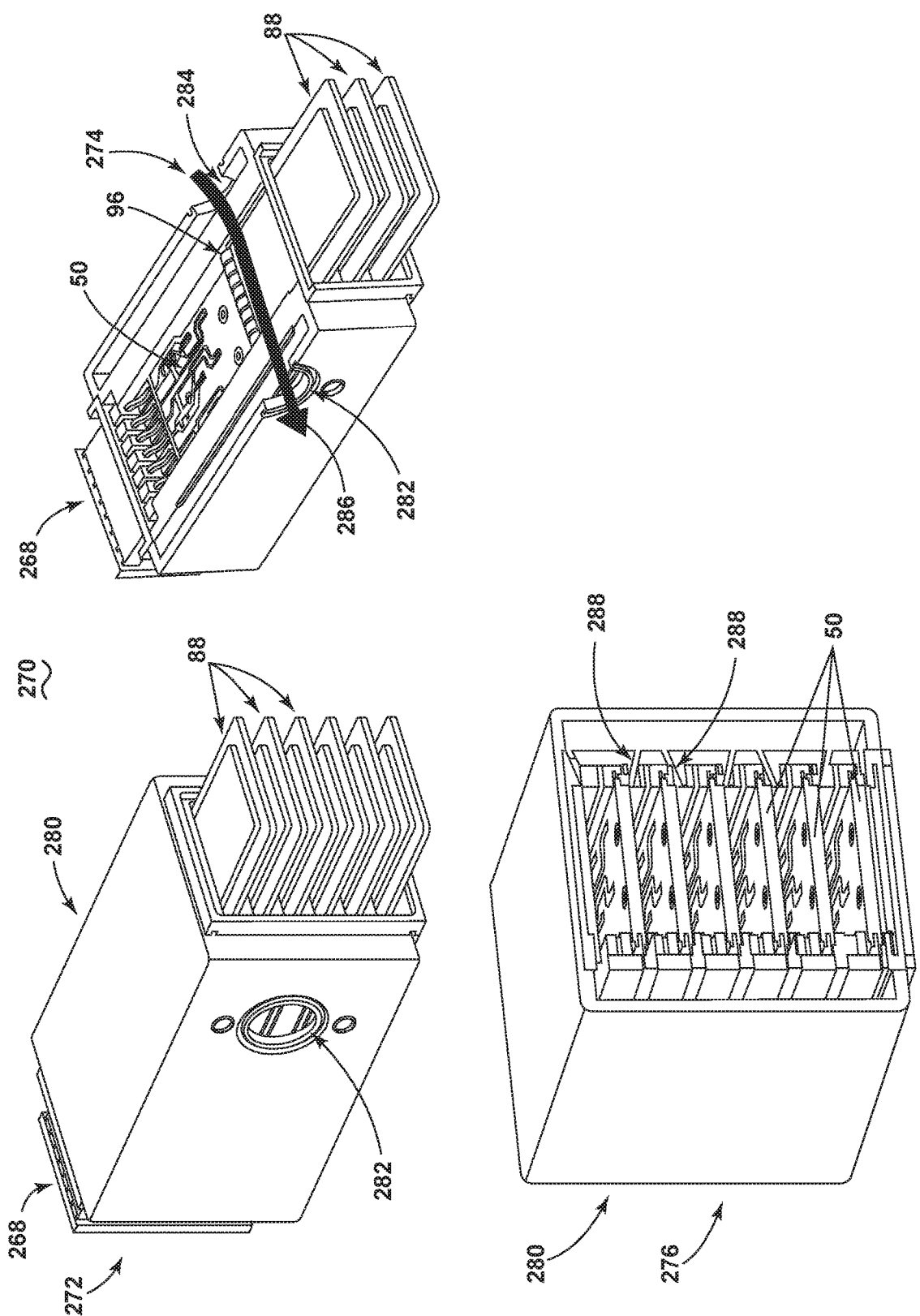
FIG. 16 illustrates a set of views of a ninth POL module assembly, in accordance with various aspects described herein.

FIG. 16 illustrates another ninth POL module assembly 270 that can be similar to the eighth POL assembly 260; therefore, like parts will be identified with like numerals, with it being understood that the description of the like parts of the eighth POL module assembly 260 applies to the ninth POL module assembly 270, unless otherwise noted. The ninth POL module assembly 270 includes aspects of a fluid cooling system, and is illustrated in a first isometric view 272 with a cooling housing 280, a second cross-sectional view 274 showing aspects of the lateral coolant flow, and a third cross-sectional view 276 taken along an axial direction of the housing 280 illustrating the cooling channels for the set of second POL assemblies 50, for understanding.

As shown in the first view 272, the housing 280 can include at least one fluid coolant input or output, shown as a coolant output 282. As better seen in the second view 272, the housing 280 can further include a coolant input 284, and whereby coolant received at the coolant input 284 can be delivered laterally across the set of second POL assemblies 50, cooling the assemblies 50 or otherwise removing heat from the housing 280. The coolant flow is represented as arrow 286. As seen in the third view 276, the housing 280 can include a set of laterally-oriented coolant channels 288 to ensure that coolant received at the coolant input 284 is delivered to each stacked second POL assembly 50. In one non-limiting example, the set of coolant channels 288 can be configured to delivered coolant to both the top and bottom surfaces of the set of second POL assemblies 50.

Aspects of the ninth POL module assembly 270 develops technologies that both minimize mean component temperatures and manage thermal transients that affect peak temperatures. For instance, an additive manufacturing liquid-cooled heat sink is developed for a high-performance cooling that integrates into a practical package. The ninth POL module assembly 270 can utilize 3D printing to generate an optimal arrangement of surface features that maximize local cooling within a power folds architecture. It can also identify ways to extend the 3D printed components to reduce assembly thickness, integrate fluid circuit connectors, and provide elements for structural assembly. It can further explore options for full immersion cooling of the power components and power overlay as part of an integrated package.

Many other possible aspects and configurations in addition to that shown in the above figures are contemplated by the present disclosure.

The aspects disclosed herein provide a set of power overlay assemblies and power converter module packages.

To the extent not already described, the different features and structures of the various aspects can be used in combination with each other as desired. That one feature is not illustrated in all of the aspects is not meant to be construed that it is not included, but is done for brevity of description. Thus, the various features of the different aspects can be mixed and matched as desired to form new aspects of the disclosure, whether or not the new aspects are expressly described. All combinations or permutations of features described herein are covered by this disclosure.

This written description uses examples to disclose aspects of the disclosure, including the best mode, and also to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure may also be embodied in any permutation of aspects of the disclosure, including but not limited to the following technical solutions as defined in the enumerated aspects:

1. A modular power overlay architecture, comprising:
   a first set of power overlay tiles defining a substantially planar arrangement of power switching components arranged on a first substrate and defining a first planar footprint;
   a second set of power overlay tiles defining a substantially planar arrangement of power switching components arranged on a second substrate and defining a second planar footprint, the second planar footprint equal to the first planar footprint; and
   a power overlay assembly base having a set of seats sized to selectively receive a subset of the first set of power overlay tiles, a subset of the second power overlay tiles, or a subset of first and second power overlay tiles;
   wherein the selectively receiving of the subset of power overlay tiles is based on a satisfying a desired power module characteristics and wherein the subset of power overlay tiles are further replaceably interchangeable.

2. The modular power overlay architecture of any of the disclosed aspects, wherein the power switching components include solid state switching components.

3. The modular power overlay architecture of any of the disclosed aspects, wherein the solid state switching components are silicon carbide switching components.

4. The modular power overlay architecture of any of the disclosed aspects, wherein the power switching components further include a set of rectifying components.

5. The modular power overlay architecture of any of the disclosed aspects wherein each of the first set of power overlay tiles and each of the second set of power overlay tiles includes an upper conductive surface of the respective tile electrically connected with the respective power switching components.

6. The modular power overlay architecture of any of the disclosed aspects wherein the upper conductive surface is commonly arranged relative to each of the first and second sets of power overlay tiles.

7. The modular power overlay architecture of any of the disclosed aspects wherein the upper conductive surface defines a source terminal for the respective first and second sets of power overlay tiles.

8. The modular power overlay architecture of any of the disclosed aspects wherein the respective power switching components of the first and second sets of power overlay tiles are arranged on a lower surface of the respective tile, opposite the upper conductive surface, and electrically connected with the upper conductive surface of the respective tile.

9. The modular power overlay architecture of any of the disclosed aspects wherein a surface of the power switching component distal from the respective tile defines a drain connection of the power switching component.

10. The modular power overlay architecture of any of the disclosed aspects, further comprising a lower conductive surface overlying and electrically connected with each of the drain connections of the power switching components, defining a power overlay tile drain connection.

11. The modular power overlay architecture of any of the disclosed aspects wherein the upper conductive surface and the lower conductive surface are configured to directly connect with the set or subset of first set of power overlay tiles or second set of power overlay tiles by way of non-wire bonded connections.

12. The modular power overlay architecture of any of the disclosed aspects wherein the upper conductive surface and the lower conductive surface allow for reduced inductance connections with the set or subset of first set of power overlay tiles or second set of power overlay tiles, compared with wire bond connections.

13. The modular power overlay architecture of any of the disclosed aspects wherein the upper conductive surface and the lower conductive surface allow for reduced inductance connections with the set or subset of first set of power overlay tiles or second set of power overlay tiles such that each of the set or subset of first set of power overlay tiles or second set of power overlay tiles are within 10% inductance and impedance of each other.

14. A method of configuring a power overlay architecture, the method comprising:
   determining a power overlay architecture demand;
   based on the power overlay architecture demand, selecting a set of power overlay tiles from at least two power overlay tile configurations, wherein each of the at least two power overlay tile configurations includes a substantially planar arrangement of power switching components arranged on a substrate and defining a common planar footprint; and
   receiving, by a power overlay assembly base having a set of seats sized to receive the common planar footprint, the set of power overlay tiles in the set of seats, such that the arrangement of the receiving satisfies the determined power overlay architecture demand.

15. The method of any of the disclosed aspects wherein each of the set of power overlay tiles includes an upper conductive surface of the respective tile electrically connected with the respective power switching components.

16. The method of any of the disclosed aspects wherein the upper conductive surface is commonly arranged relative to each of the set of power overlay tiles.

17. The method of any of the disclosed aspects wherein the upper conductive surface defines a source terminal for the respective first and second sets of power overlay tiles 18. The method of any of the disclosed aspects wherein the respective power switching components of the selected set of power overlay tiles are arranged on a lower surface of the respective tile, opposite the upper conductive surface, and electrically connected with the upper conductive surface of the respective tile.

19. The method of any of the disclosed aspects, further comprising a lower conductive surface overlying and electrically connected with a drain connection on each of the power switching components, the drain connection being a surface of the power switching component distal from the respective tile, and wherein the lower conductive surface defines a power overlay assembly drain connection.

20. The method of any of the disclosed aspects wherein the upper conductive surface and the lower conductive surface allow for reduced inductance connections with the set of selected power overlay tiles, such that each of the set of selected power overlay tiles are within 10% inductance and impedance of each other.

What is claimed is:
1. A modular power overlay architecture, comprising:
   a first set of power overlay tiles defining a substantially planar arrangement defining a first planar footprint, and including a first conductive surface and a second surface, opposite the first conductive surface, the second surface including power switching components electrically connected with the first conductive surface, and wherein a surface of the power switching component distal from the respective tile defines a drain connection of the power switching component;
   a second set of power overlay tiles defining a substantially planar arrangement defining a second planar footprint, the second planar footprint equal to the first planar footprint, and including a first conductive surface and a second surface, opposite the first conductive surface, the second surface including power switching components electrically connected with the first conductive surface, and wherein a surface of the power switching component distal from the respective tile defines a drain connection of the power switching component; and
   a substantially planar power overlay assembly base having a set of seats sized to selectively receive a subset of the first set of power overlay tiles, a subset of the second power overlay tiles, or a subset of first and second power overlay tiles;
   wherein the selectively receiving of the subset of power overlay tiles is based on a satisfying a desired power module characteristics and wherein the subset of power overlay tiles are further replaceably interchangeable.

2. The modular power overlay architecture of claim 1, wherein the power switching components include solid state switching components.

3. The modular power overlay architecture of claim 2, wherein the solid state switching components are silicon carbide switching components.

4. The modular power overlay architecture of claim 2, wherein the power switching components further include a set of rectifying components.

5. The modular power overlay architecture of claim 1 wherein the first conductive surface is commonly arranged relative to each of the first and second sets of power overlay tiles.

6. The modular power overlay architecture of claim 1 wherein the first conductive surface defines a source terminal for the respective first and second sets of power overlay tiles.

7. The modular power overlay architecture of claim 1, further comprising a second conductive surface overlying and electrically connected with each of the drain connections of the power switching components, defining a power overlay tile drain connection.

8. The modular power overlay architecture of claim 7 wherein the first conductive surface and the second conductive surface are configured to directly connect with the set or subset of first set of power overlay tiles or second set of power overlay tiles by way of non-wire bonded connections.

9. The modular power overlay architecture of claim 8 wherein the first conductive surface and the second conductive surface allow for reduced inductance connections with the set or subset of first set of power overlay tiles or second set of power overlay tiles, compared with wire bond connections.

10. The modular power overlay architecture of claim 8 wherein the first conductive surface and the second conductive surface allow for reduced inductance connections with the set or subset of first set of power overlay tiles or second set of power overlay tiles such that each of the set or subset of first set of power overlay tiles or second set of power overlay tiles are within 10% inductance and impedance of each other.

11. A method of configuring a power overlay architecture, the method comprising:
  determining a power overlay architecture demand;
  based on the power overlay architecture demand, selecting a set of power overlay tiles from at least two power overlay tile configurations, wherein each of the at least two power overlay tile configurations includes a substantially planar arrangement of power switching components arranged on a substrate and defining a common planar footprint, and wherein each of the at least two power overlay tile configurations includes a first conductive surface of the respective tile electrically connected with the respective power switching component; and
  receiving, by a substantially planar power overlay assembly base having a set of seats sized to receive the common planar footprint, the set of power overlay tiles in the set of seats, such that the receiving of the set of power overlay tiles satisfies the determined power overlay architecture demand;
  wherein the respective power switching components of the selected set of power overlay tiles are arranged on a second conductive surface of the respective tile, opposite the first conductive surface, the second conductive surface overlying and electrically connected with a drain connection on each of the power switching components, the drain connection being a surface of the power switching component distal from the respective tile, and wherein the second conductive surface defines a power overlay assembly drain connection, and wherein the second conductive surface is electrically connected with the first conductive surface of the respective tile.

12. The method of claim 11 wherein the first conductive surface is commonly arranged relative to each of the set of power overlay tiles.

13. The method of claim 11 wherein the first conductive surface defines a source terminal for the respective first and second sets of power overlay tiles.

14. The method of claim 11 wherein the first conductive surface and the second conductive surface allow for reduced inductance connections with the set of selected power overlay tiles, such that each of the set of selected power overlay tiles are within 10% inductance and impedance of each other.

* * * * *